US012794471B2

(12) United States Patent
Lin

(10) Patent No.: US 12,794,471 B2
(45) Date of Patent: Nov. 10, 2026

(54) LEVEL SHIFT CIRCUIT AND HIGH-VOLTAGE HALF-BRIDGE DRIVER CHIP

(71) Applicant: SUTENG INNOVATION TECHNOLOGY CO., LTD., Shenzhen (CN)

(72) Inventor: Xingkui Lin, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/909,915

(22) Filed: Oct. 8, 2024

(65) Prior Publication Data

US 2025/0211231 A1 Jun. 26, 2025

(30) Foreign Application Priority Data

Dec. 26, 2023 (CN) ......................... 202311816649.6

(51) Int. Cl.
*H03K 19/0185* (2006.01)
*H03K 17/687* (2006.01)

(52) U.S. Cl.
CPC . *H03K 19/018507* (2013.01); *H03K 17/6871* (2013.01); *H03K 2217/0063* (2013.01); *H03K 2217/0072* (2013.01)

(58) Field of Classification Search
CPC ....... H03K 19/0175; H03K 19/017509; H03K 19/0185; H03K 19/018507; H03K 19/018514; H03K 19/018521; H03K 19/018528; H03K 17/0063; H03K 17/08122; H03K 17/687; H03K 17/6871; H03K 17/6872; H03K 17/6874; H03K 2217/0063; H03K 2217/0072
See application file for complete search history.

(56) References Cited

U.S. PATENT DOCUMENTS

2024/0223190 A1* 7/2024 Lam ................. H03K 19/00315

* cited by examiner

*Primary Examiner* — Long Nguyen
(74) *Attorney, Agent, or Firm* — BAYES PLLC

(57) ABSTRACT

The embodiment of the present application discloses a level shift circuit and a high-voltage half-bridge driver chip. The level shift circuit includes a first and a second high-voltage MOS transistor, a cross-coupling module and a conversion module; a controlled end of the first high-voltage MOS transistor; a controlled end of the second high-voltage MOS transistor; the cross-coupling module includes a first current mirror and a second current mirror; the first and second nodes of the conversion module are respectively connected to the first and second current mirrors through the first and second nodes, to output an output signal.

5 Claims, 14 Drawing Sheets

LEVEL SHIFT CIRCUIT AND HIGH-VOLTAGE HALF-BRIDGE DRIVER CHIP

CROSS-REFERENCE TO RELATED APPLICATION

The present application claims the benefit of priority to Chinese Patent Application No. 202311816649.6, filed on Dec. 26, 2023, which is hereby incorporated by reference in its entirety.

TECHNICAL FIELD

The present application relates to the field of LiDAR technology, and in particular to a level shift circuit and a high-voltage half-bridge driver chip.

BACKGROUND

LiDAR usually uses a high-voltage half-bridge driver chip to charge and discharge the load, to complete light emission and reset. The high-voltage half-bridge driver chip usually includes a logic circuit, a high-side control circuit, a low-side control circuit, a high-side switch, and a low-side switch. When the high-side switch is turned on, the load is charged; when the low-side switch is turned on, the load is discharged.

However, the high-voltage half-bridge driver chip will generate a large dV/dt, causing the high-voltage level shift circuit inside the high-side control circuit to generate common-mode noise. The common-mode noise will interfere with the transmission of normal signals, resulting in the loss of the normal signal's duty cycle. In severe cases, there may be problems with signal locking, leading to abnormal load charging and discharging, thus affecting the use of the LiDAR.

A filtering module is usually added to the high-voltage level shifting circuit. The filtering module includes capacitors and resistors. When the common-mode noise is small, it can be filtered out by the filtering module. However, when the power switching device operates at a higher frequency and higher voltage, the common-mode noise generated is greater. It is necessary to increase the resistance or capacitance to filter out the common-mode noise. This will introduce more delays and reduce the signal transmission speed.

SUMMARY

Embodiments of the present application provide a level shift circuit and a high-voltage half-bridge driver chip. The level shift circuit can filter out common-mode noise to ensure the stability of the output signal, and does not require the setting of large resistors or capacitors, thereby reducing delays and improving the speed of signal transmission.

In a first aspect, an embodiment of the present application provides a level shift circuit, include a first high-voltage MOS transistor, a second high-voltage MOS transistor, a cross-coupling module and a conversion module; the first high-voltage MOS transistor, a controlled end of which is configured to obtain a set signal, a first end of which is grounded, and a second end of which is configured to obtain a power supply voltage; the second high-voltage MOS transistor, a controlled end of which is configured to obtain a reset signal, a first end of which is grounded, and a second end of which is configured to obtain a power supply voltage; the cross-coupling module, which includes a first current mirror and a second current mirror, a first end of the first current mirror is configured to obtain a first current when the first high-voltage MOS transistor is turned on, a second end of the first current mirror is grounded, a first end of the second current mirror is configured to obtain a second current when the second high-voltage MOS transistor is turned on, a second end of the second current mirror is grounded, where the first current is greater than or equal to N times the second current, and N is a positive integer; the conversion module, a first end of which is connected to the first end of the first current mirror through a first node, a second end of which is connected to the first end of the second current mirror through a second node, a third end of which is respectively connected to the third end of the first current mirror and the second node, the fourth end of which is respectively connected to the third end of the second current mirror and the first node, and a fifth end of which is configured to output an output signal.

The level shift circuit provided in an embodiment, by making the first current larger than N times the second current, the first current is much larger than the second current, a potential of the first node corresponding to the first current is higher than a potential of the second node corresponding to the second current, even if there is common-mode noise, the common-mode noise can be filtered out by the difference between the first current and the second current, so that high common-mode transient noise suppression capability is achieved without introducing large capacitors and large bias currents. The cross-coupling module includes the first current mirror and the second current mirror is a positive feedback structure, the potential of the second node can be further lowered, thereby weakening the pull-down of the first node, and the first node will rise to achieve low transmission delay and accelerate response speed.

In some embodiments, the first current mirror includes a first N-type metal-oxide-semiconductor transistor and a second N-type metal-oxide-semiconductor transistor, where the drain of the first N-type metal-oxide-semiconductor transistor is configured to obtain the first current, the drain of the second N-type metal-oxide-semiconductor transistor is configured to obtain the third current, and a width-to-length ratio of the second N-type metal-oxide-semiconductor transistor is greater than a width-to-length ratio of the first N-type metal-oxide-semiconductor transistor; the second current mirror includes a third N-type metal-oxide-semiconductor transistor and a fourth N-type metal-oxide-semiconductor transistor, the drain of the third N-type metal-oxide-semiconductor transistor is configured to obtains the second current, the drain of the fourth N-type metal-oxide-semiconductor transistor is configured to obtain the fourth current, and a width-to-length ratio of the fourth N-type metal-oxide-semiconductor transistor is greater than a width-to-length ratio of the third N-type metal-oxide-semiconductor transistor; the first current is greater than or equal to the fourth current.

In an embodiment, the first current mirror and the second current mirror form a positive feedback structure, when the first current is N times second current, since a width-to-length ratio of the second NMOS transistor is greater than a width-to-length ratio of the first NMOS transistor MN1, the third current is greater than the first current. The third current is high, that is, the third current is much greater than the second current. The level of the second node is pulled down by the third current, making the fourth current smaller. The pull-down of the first node is weakened, and the first node will rise rapidly to achieve low transmission delay and accelerate response speed.

In some embodiments, the conversion module includes a fifth N-type metal-oxide-semiconductor transistor, a sixth N-type metal-oxide-semiconductor transistor, a seventh N-type metal-oxide-semiconductor transistor and an eighth N-type metal-oxide-semiconductor transistor; the fifth N-type metal-oxide-semiconductor transistor, the source of which is respectively connected to the drain of the second N-type metal-oxide-semiconductor transistor and the drain of the third N-type metal-oxide-semiconductor transistor, and the gate is short-circuited with the drain; the sixth N-type metal-oxide-semiconductor transistor, the source of which is respectively connected to the drain of the fourth N-type metal-oxide-semiconductor transistor and the drain of the first N-type metal-oxide-semiconductor transistor, and the gate is short-circuited with the drain; the seventh N-type metal-oxide-semiconductor transistor, the source of which is connected to the drain of the fifth N-type metal-oxide-semiconductor transistor, and the gate is connected to the first node; the eighth N-type metal-oxide-semiconductor transistor, the source of which is connected to the drain of the sixth N-type metal-oxide-semiconductor transistor, and the gate is connected to the second node.

In some embodiments, the level shift circuit includes: a first resistor and a second resistor; the first resistor, one end of which is configured to obtain the power supply voltage, and the other end is connected to the first node and the gate of the seventh N-type metal-oxide-semiconductor transistor; the second resistor, one end of which is configured to obtain the power supply voltage, and the other end is connected to the second node and the gate of the eighth N-type metal-oxide-semiconductor transistor.

In some embodiments, the level shift circuit includes: a positive feedback module, a first end of which is connected to the drain of the seventh N-type metal-oxide-semiconductor transistor through a third node, a second end of which is connected to the drain of the eighth N-type metal-oxide-semiconductor through a fourth node, and a third end of which is configured to obtain the power supply voltage.

In some embodiments, the positive feedback module includes a first P-type metal-oxide-semiconductor transistor and a second N-type metal-oxide-semiconductor transistor; the first P-type metal-oxide-semiconductor transistor has a gate connected to the fourth node, a source configured to obtain the power supply voltage, and a drain connected to the drain of the seventh N-type metal-oxide-semiconductor transistor; the second P-type metal-oxide-semiconductor transistor has a gate connected to the third node, a source configured to obtain the power supply voltage, and a drain connected to the drain of the eighth N-type metal-oxide-semiconductor transistor.

In some embodiments, the level shift circuit further includes: a shaping module, a first end of which is connected to the fourth node, a second end of which is configured to obtain the power supply voltage, a third end of which is grounded, and a fourth end of which is configured to output an output signal.

In some embodiments, the shaping module includes a first inverter and a second inverter; the first inverter has a first end connected to the fourth node, a second end configured to obtain the power supply voltage, and a third end grounded; the second inverter has a first end connected to the fourth end of the first inverter, a second end configured to obtain the power supply voltage, a third end grounded, and a fourth end configured to output an output signal.

In some embodiments, the level shift circuit includes: a third current mirror and a first voltage regulator transistor; the third current mirror, a first end of which is connected to the second end of the first high-voltage MOS transistor through a fifth node, a second end of which is configured to obtain the power supply voltage, and a third end of which is connected to the first node; the first voltage regulator transistor, one end of which is connected to the fifth node, and the other end of which is configured to obtain the power supply voltage.

In a second aspect, an embodiment provides a high-voltage half-bridge driver chip, include: a logic circuit, a high-side control circuit, a low-side control circuit, a high-side switch and a low-side switch; the logic circuit, a first input end of which is configured to obtain the high-side control signal, and a second input end of which is configured to obtain the low-side control signal; the high-side control circuit, include a pulse generating module and the level shift circuit; an input end of the pulse generating module is connected to a first output end of the logic circuit, for generating a set signal and a reset signal; a first input end of the level shift circuit is configured to obtain the set signal, a second input end of the level shift circuit is configured to obtain the reset signal, and the level shift circuit is configured to output an output signal according to the set signal and the reset signal; the low-side control circuit, an input end of which is connected to the second output end of the logic circuit; the high-side switch, a controlled end of which is connected to the output end of the high-side control circuit, a first end of which is configured to obtain the DC voltage, and a second end of which is connected to the load; the low-side switch, a controlled end of which is connected to the output end of the low-side control circuit, a first end of which is grounded, and a second end of which is connected to the load.

Based on the high-side control circuit provided by the embodiments, the first current can be greater than the second current, to filter out the common-mode noise and ensure the reliability of the output signal. When the first current is N times the second current, the cross-coupling module includes the first current mirror and the second current mirror is a positive feedback structure, the potential of the second node can be lowered, weakening the pull-down of the first node, and the first node will be rapidly raised to achieve low transmission delay, speed up the response speed, and improve the speed of signal transmission. Since the high-side control circuit is provided with the first resistor and the second resistor, and is not provided with a filter capacitor, etc., the static power consumption is small, and the latch in the related art can be replaced by the positive feedback module, simplifying the circuit structure, making the circuit structure simple, and having a low manufacturing cost.

REFERENCE SIGNS

Figure 1:
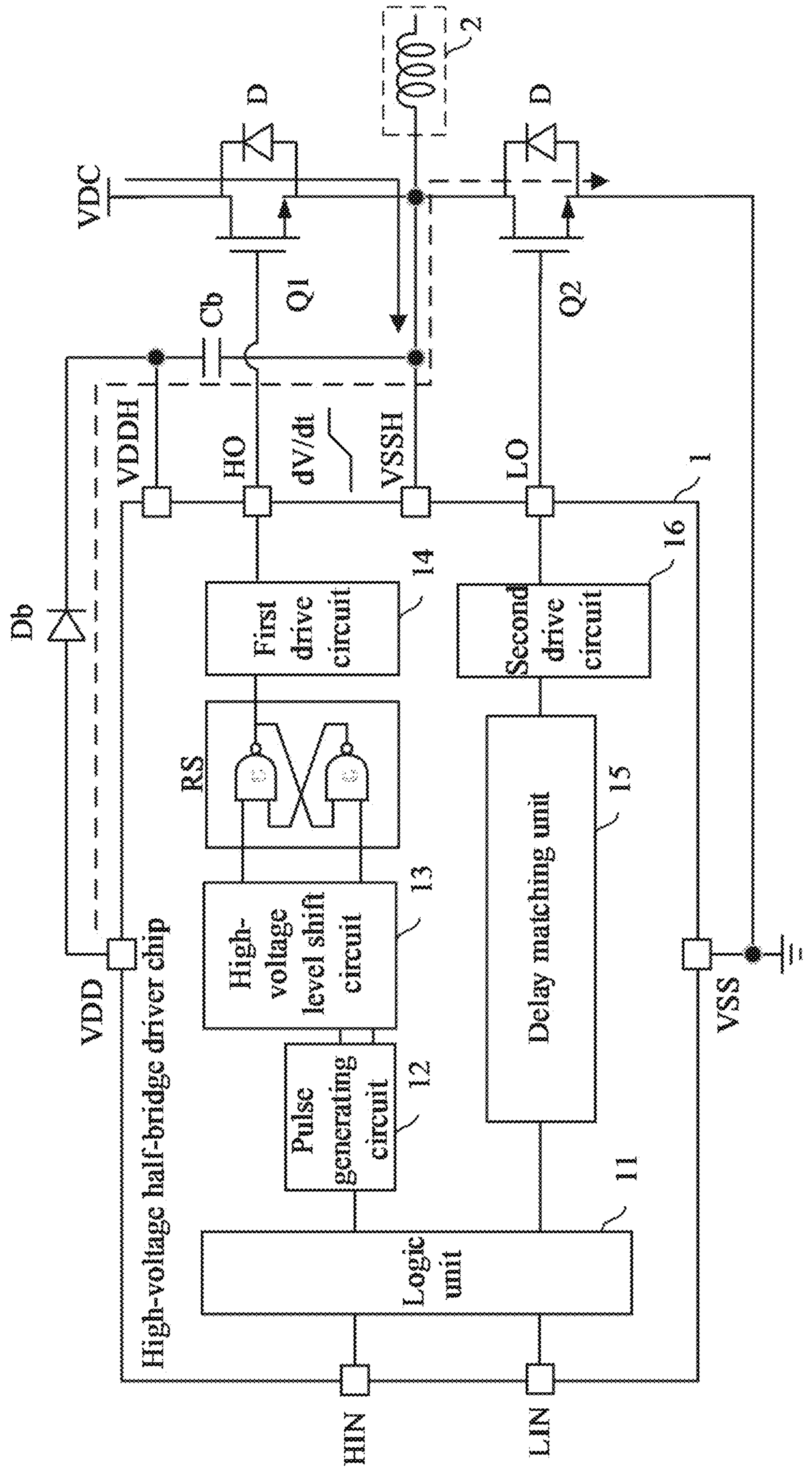
FIG. 1 is a schematic diagram of a framework structure of a high-voltage half-bridge driver chip.

1, High-voltage half-bridge driver chip; 11, Logic unit; 12, Pulse generating circuit; 13, High-voltage level shift circuit; 131, First two-stage inverting module; 132, Second two-stage inverting module; 133, First filtering module; 134, Second filtering module; 135, First mirror unit; 136, Second mirror unit; 137, First interlocking loop; 138, Second interlocking loop; 139, Third mirror unit; 1310, Fourth mirror unit; 14, First drive circuit; 15, Delay matching unit; 16, Second drive circuit; 2, Load; 3, Level shift circuit; 31, Cross-coupling module; 311, First current mirror; 312, Second current mirror; 32, Conversion module; 33, Third current mirror; 34, Fourth current mirror; 35, Positive feedback module; 36, Shaping module; 361, First inverter; 362, Second inverter; Db, bootstrap diode; Cb, bootstrap capacitor; Q1, high-side switch; Q2, low-side switch; RS, latch; HO, high-side interface; LO, low-side interface; HIN, high-side control signal; LIN, low-side control signal; VDD, first power supply voltage; VSS, first ground voltage; VDDH, second power supply voltage; VSSH, second ground voltage; VDC, DC voltage; Set, set signal; Reset, reset signal; VIN, input signal; LD1, first high-voltage switch; LD2, second high-voltage switch; C, capacitor; CP1, the first parasitic capacitor; CP2, the second parasitic capacitor; R, the resistor; R1, the first resistor; R2, the second resistor; R3, the third resistor; R4, the fourth resistor; ST1, the first Schmitt trigger; ST2, the second Schmitt trigger; DZ, the diode; Cp1, the first parasitic capacitor; Cp2, the second parasitic capacitor; A, the first node; B, the second node; C, the third node; D, the fourth node; E, the fifth node; F, the first node; Six nodes; OUT1, first signal; OUT2, second signal; OUT, output signal; MOS1, first MOS transistor; MOS2, second MOS transistor; MOS3, third MOS transistor; MOS4, fourth MOS transistor; MOS5, fifth MOS transistor; MOS6, sixth MOS transistor; INV1, third inverter; INV2, fourth inverter; BiasN, first bias current; BiasP, second bias current; Dz1, first voltage regulator diode; Dz2, second voltage regulator diode; I1, first current; I2, second current; I3, third current; I4, fourth current; MN1, first NMOS transistor; MN2, second NMOS transistor; MN3, third NMOS transistor; MN4, fourth NMOS transistor; MN5, fifth NMOS transistor; MN6, sixth NMOS transistor; MN7, seventh NMOS transistor; MN8, eighth NMOS transistor; MP1, first PMOS transistor; MP2, second PMOS transistor; MP3, third PMOS transistor; MP4, fourth PMOS transistor.

DETAILED DESCRIPTION

In order to make the objectives, technical solutions and advantages of the present application clearer, the embodiments of the present application will be further described in detail below with reference to the accompanying drawings.

When the following description refers to the drawings, unless otherwise indicated, the same numbers in different drawings represent the same or similar elements. The embodiments described in the following exemplary embodiments.

The terms "first," "second," etc. are used for descriptive purposes only and are not to be understood as indicating or implying relative importance. Unless otherwise specified, "multiple" refers to two or more. "And/or" describes the association relationship of associated objects, indicating that three relationships may exist. For example, A and/or B can represent: A exists alone, A and B exist at the same time, and B exists alone. The character "/" generally indicates that the previously associated objects are in an "or" relationship.

Lidar: a radar system that uses laser beams to detect the position, speed, and other characteristic quantities of a target. To emit a detection signal (laser beam) to a target object, and compare the received echo signal reflected from the target object with the detection signal (or local oscillator signal). After processing, relevant information about the target object relative to the Lidar can be obtained, such as distance, direction, height, speed, attitude, and even shape parameters.

Half-bridge circuit: based on field effect transistors with switching control functions such as Metal Oxide Semiconductor Field Effect Transistor (MOSFET). The on-time of MOSFET is controlled by pulse width modulation (PWM) signal, so that MOSFET works in high level or low level mode in each cycle.

Gallium nitride (GaN) material, as a new type of wide bandgap semiconductor material, has a higher critical breakdown voltage, higher electron mobility and higher maximum operating temperature. It can replace traditional silicon (Si) material and is widely used in the preparation of high-voltage and high-frequency power switching devices.

For example, a half-bridge circuit is used in a LiDAR to charge and discharge the load (e.g., the laser), thereby complete the light emission and reset of the laser. As shown in FIG. 1, a high-voltage half-bridge driver chip 1 (High-Voltage Half-Bridge Driver) includes a logic unit 11 (Logic Units), a pulse generating circuit 12 (Pulse Generate Circuit), a high-voltage level shift circuit 13 (High-Voltage Level Shift), a latch RS, a first driving circuit 14 (Driver), a delay matching unit 15 (Delay Matching Unit), and a second driving circuit 16. The high-voltage half-bridge driver chip 1 is connected to a driving circuit, which includes a bootstrap diode Db, a bootstrap capacitor Cb, a high-side switch Q1, and a low-side switch Q2. The high-voltage half-bridge driver chip 1 is provided with a first interface, a second interface, a first voltage interface, a ground interface, a high-side interface HO, a low-side interface LO, a second voltage interface and a third voltage interface, the first interface is configured to obtain a high-side control signal HIN, the second interface is configured to obtain a low-side control signal LIN, the first voltage interface is configured to obtain a first power supply voltage VDD, the ground interface is configured to obtain a first ground voltage VSS, the second voltage interface is configured to obtain a second power supply voltage VDDH, and the third voltage interface is configured to obtain a second ground voltage VSSH.

A first output end of the logic unit 11 is connected to an input end of the pulse generating circuit 12, a first output end and a second output end of the pulse generating circuit 12 are connected to a first input end and a second input end of the latch RS, an output end of the latch RS is connected to the input end of the first driving circuit 14, the output end high side interface HO of the first driving circuit 14 is connected to the controlled end of the high side switch Q1, one end of the high side switch Q1 is connected to the DC voltage VDC, and the other end of the high side switch Q1 is connected to the load 2. A second output end of the logic unit 11 is connected to an input end of the delay matching unit 15, an output end of the delay matching unit 15 is connected to an input end of the second driving circuit 16, an output end of the second driving circuit 16 is connected to the controlled end of the low side switch Q2 through the low side interface LO, one end of the low side switch Q2 is connected to the other end of the high side switch Q1 through a common node, and is connected to the load 2, and the other end of the low side switch Q2 is connected to the first ground voltage VSS. One end of the power supply voltage interface is also connected to the anode of the bootstrap diode Db, the cathode of the bootstrap diode Db is connected to the second voltage interface 1*e* and a first plate of the bootstrap capacitor Cb, and a second plate of the bootstrap capacitor Cb is connected to the third voltage interface If and the load 2.

The first input end of the logic unit 11 is connected to the first interface to obtain the high-side control signal HIN, and the second input end of the logic unit 11 is connected to the second interface to obtain the low-side control signal LIN. The high-side control signal HIN and the low-side control signal LIN are processed by the logic unit 11 and output to the high-side signal, through the pulse generating circuit 12 and the delay matching unit 15 respectively. The high-side control signal HIN generates two narrow pulse signals after passing through the pulse generating circuit 12, and then passes through the high-voltage level shifting circuit 13 to perform voltage domain conversion, and converts the voltage domain of the signal from the first power supply voltage VDD-first ground voltage Vset the second power supply voltage VDDH-second ground voltage VSSH. Thereafter, the latch RS restores the two narrow pulses to square wave signals, and then passes through the first driving circuit 14 to perform power amplification and outputs to the controlled end of the high-side switch Q1 through the high-side interface HO, to control the on and off of the high-side switch Q1. The low-side control signal LIN is output to the second drive circuit 16 after passing through the delay matching unit 15. The second drive circuit 16 performs power amplification and outputs the signal to the controlled end of the low-side switch Q2 through the low-side interface LO, to control the on and off of the low-side switch Q2. The high-side switch Q1 and the low-side switch Q2 are usually made of GaN material.

Exemplarily, when charging load 2, the high-side control signal HIN is at a high level, the high-side switch Q1 is turned on, the low-side control signal LIN is at a low level, the low-side switch Q2 is turned off, and the DC voltage VDC charges load 2; when load 2 is discharging, the high-side control signal HIN is at a low level, the high-side switch Q1 is turned off, the low-side control signal LIN is at a high level, the low-side switch Q2 is turned on, and load 2 discharges through the low-side switch Q2.

When the high-voltage half-bridge driver chip 1 is working, the low-side control signal LIN signal controls the low-side switch Q2 to turn on first, and the high-side control signal HIN controls the high-side switch Q1 to turn off. The first power supply voltage VDD charges the bootstrap capacitor Cb through the bootstrap diode Db. The charging current is shown by the dotted line in FIG. 1, so that the voltage across the bootstrap capacitor Cb is the first power supply voltage VDD. Then, the low-side switch Q2 is controlled to turn off, and the high-side switch Q1 is controlled to turn on. The voltage of the third power supply interface is rapidly raised to the DC voltage VDC, that is, the voltage of the second ground voltage VSSH is rapidly raised to the DC voltage VDC. The current flow is shown by the solid line in FIG. 1. Due to the voltage difference across the bootstrap capacitor Cb cannot change suddenly, the voltage of the second power supply voltage VDDH will be quickly raised to the sum of the DC voltage VDC and the first power supply voltage VDD. When the DC voltage VDC is very high, reaching several hundred volts, and the switching speed of the GaN power switch device is very fast, the second ground voltage VSSH will rise to several hundred volts in a short time. In this way, a large dV/dt will be generated, causing the high-voltage level shift circuit 13 inside the high-voltage half-bridge driver chip 1 to generate common-mode noise, affecting the transmission of normal signals, that is, the common-mode noise will interfere with the transmission of normal signals, resulting in the loss of the duty cycle of normal signals, and even the problem of signal locking, resulting in abnormal load charging and discharging, thereby affecting the normal use of the LiDAR. Before the high-voltage half-bridge driver chip 1 works, it is necessary to measure the ability of the high-voltage level shift circuit 13 to withstand transient noise, that is, the common-mode transient noise suppression (Common Mode Transient Immunity, CMTI) capability, in order to measure the reliability of the use of the high-voltage level shift circuit 13.

Figure 2:
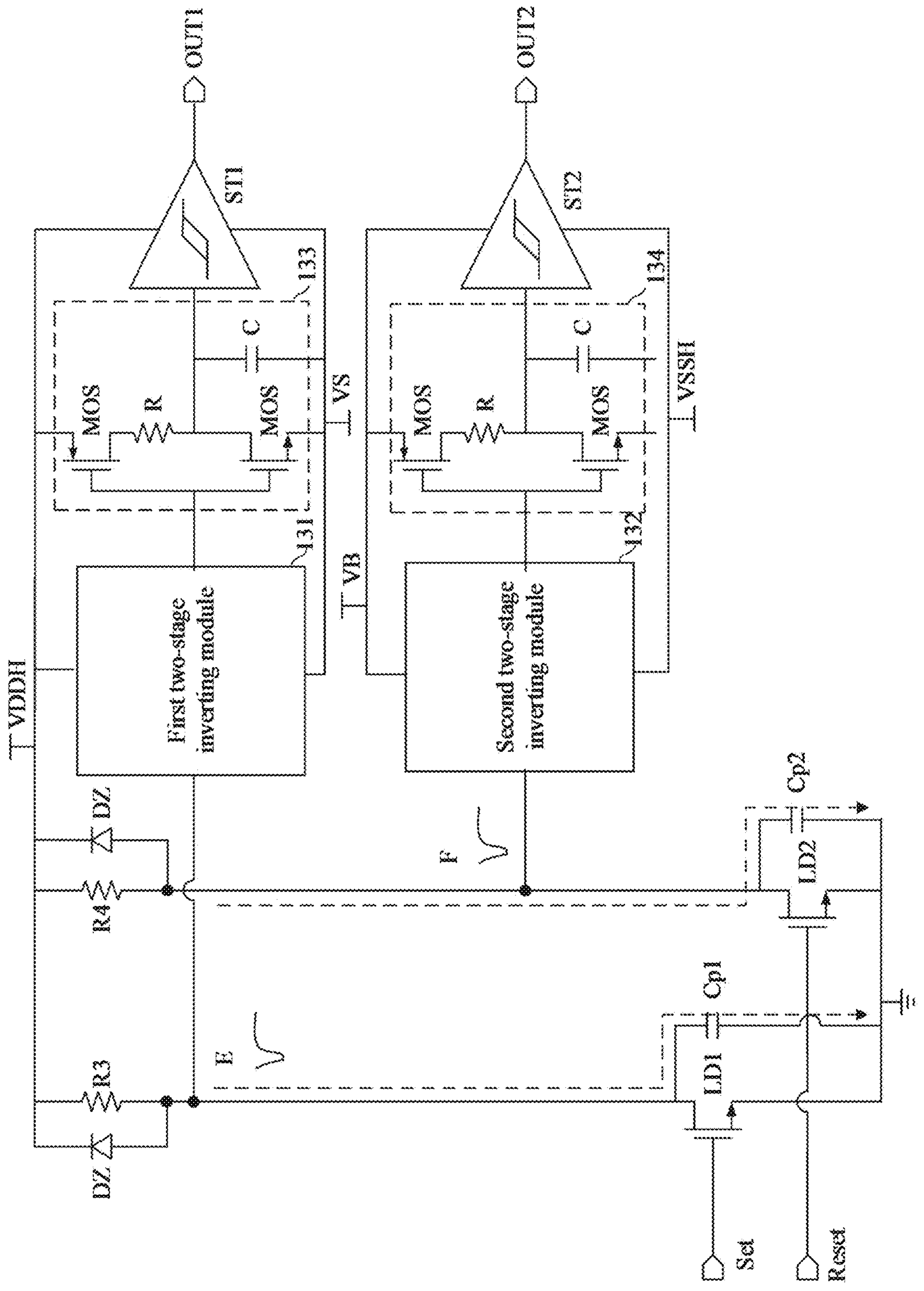
FIG. 2 is a schematic diagram of a circuit structure of a high-voltage level shift circuit.

An example is to suppress common-mode noise through resistors and capacitors. As shown in FIG. 2, the high-voltage level shift circuit 13 may include a first high-voltage MOS transistor LD1, a second high-voltage MOS transistor LD2, a first parasitic capacitor CP1, a second parasitic capacitor CP2, a third resistor R3, a fourth resistor R4, a first two-stage inverter module 131, a second two-stage inverter module 132, a first filter module 133, a second filter module 134, a first Schmitt trigger ST1, and a second Schmitt trigger ST2. A controlled end of the first high-voltage MOS transistor LD1 is configured to obtain the set signal Set, a controlled end of the second high-voltage MOS transistor LD2 is configured to obtain the reset signal Reset, one end of the first high-voltage MOS transistor LD1 and one end of the second high-voltage MOS transistor LD2 are grounded, the other end of the first high-voltage MOS transistor LD1 is connected to one end of the third resistor R3, the other end of the third resistor R3 is connected to the second power supply voltage VDDH, the other end of the second high-voltage MOS transistor LD2 is connected to one end of the fourth resistor R4, and the other end of the fourth resistor R4 is connected to the second power supply voltage VDDH. The other end of the first high-voltage MOS transistor LD1 is connected to one end of the first two-stage inverter module 131 through the fifth node E, the other end of the second high-voltage MOS transistor LD2 is connected to one end of the second two-stage inverter module 132 through the sixth node F, and the third resistor R3 and the fourth resistor R4 can be connected in parallel with a diode DZ respectively.

Figure 3:
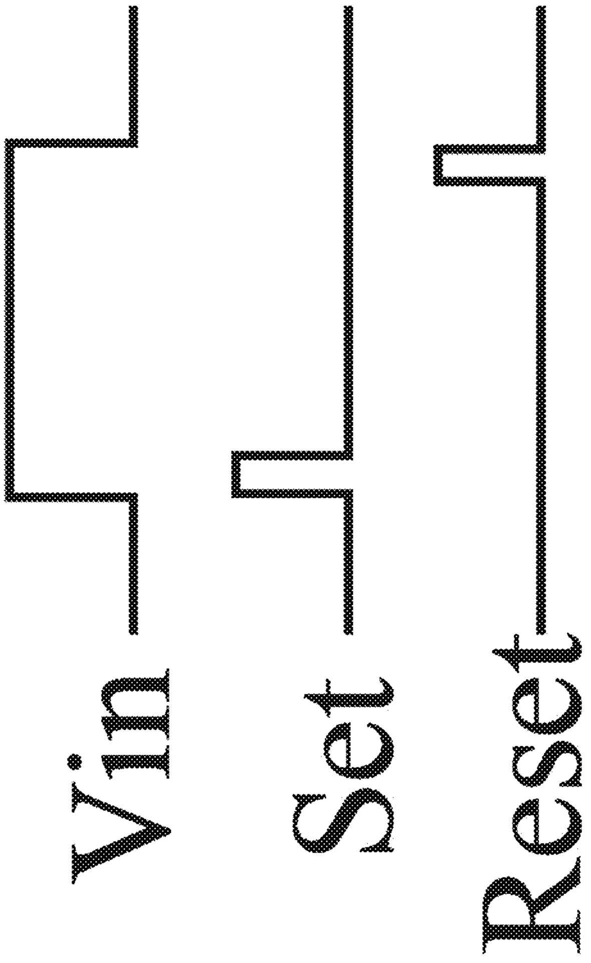
FIG. 3 is a waveform diagram of an input signal, a set signal, and a reset signal.

As shown in FIG. 3, the set signal Set and the reset signal Reset are obtained by collecting the rising edge and the falling edge of the input signal VIN by the preceding narrow pulse generating circuit. The set signal Set and the reset signal Reset control the first high-voltage MOS transistor LD1 and the second high-voltage MOS transistor LD2 to be alternately turned on. When the set signal Set is obtained, the first high-voltage MOS transistor LD1 is turned on to pull down the potential of the fifth node E. The sixth node F maintains a high level. After being shaped by the first two-stage inverter module 131, a first signal OUT1 is output through the first Schmitt trigger ST1. The second signal OUT2 is output through the second Schmitt trigger ST2. When the second ground voltage VSSH and the second power supply voltage VDDH in the high-voltage half-bridge driver chip 1 rise rapidly to generate a large dV/dt, a common-mode noise current is generated on the first parasitic capacitor Cp1 and the second parasitic capacitor Cp2 at the fifth node E and the sixth node F, and the current flows through the third resistor R3 and the fourth resistor R4 to generate a common-mode noise voltage. The fifth node E and the sixth node F are pulled down. When the common-mode noise signal is small, it can be eliminated by the first filtering module 133 and the second filtering module 134 includes a metal-oxide-semiconductor field effect transistor (MOS), a capacitor C and a resistor R.

When the first high-voltage MOS transistor LD1 and the second high-voltage MOS transistor LD2 operate at a higher frequency and a higher voltage, the common-mode noise generated by the high-voltage half-bridge driver chip 1 is greater. It is necessary to increase the resistance R or the capacitance C in the first filter module 133 and the second filter module 134 to eliminate the large common-mode noise. This will introduce more delays, thereby reducing the transmission speed of normal signals. Since the high-side switch Q1 and the low-side switch Q2 are made of GaN materials, based on the special properties of GaN materials, the power switch device made of GaN materials needs to work in a high-voltage and high switching speed scenario, resulting in the driver chip driving the power switch device must also have the characteristics of high-voltage resistance and low delay, the high-voltage half-bridge driver chip 1 needs to have the characteristics of high-voltage resistance and low delay. When filtering the large common-mode noise through the first filter module 133 and the second filter module 134 composed of capacitor C and resistor R, more delays are introduced. In this way, if want to have a higher CMTI capability, more delays will be introduced. If want to have a lower transmission delay to increase the signal transmission speed, it cannot have a higher CMTI capability, and it cannot achieve compatibility between a higher CMTI capability and a low transmission delay.

Figure 4:
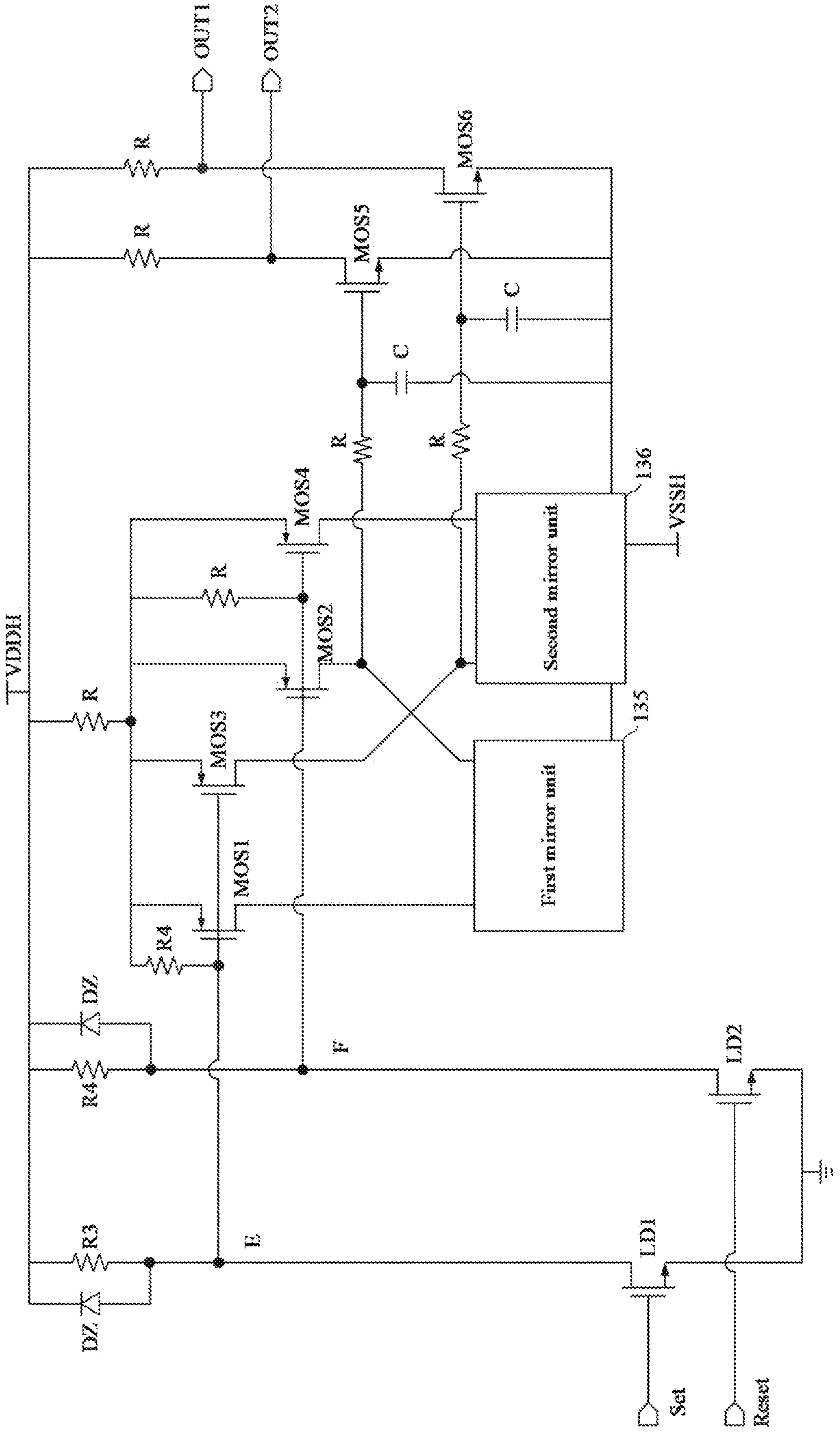
FIG. 4 is a schematic diagram of a circuit structure of a high-voltage level shift circuit.

An example is to suppress common mode noise by canceling out the currents. As shown in FIG. 4, the high-voltage level shift circuit 13 include a first high-voltage MOS transistor LD1, a second high-voltage MOS transistor LD2, a third resistor R3, a fourth resistor R4, multiple resistors R, a first MOS transistor MOS1, a second MOS transistor MOS2, a third MOS transistor MOS3, a fourth MOS transistor MOS4, a fifth MOS transistor MOS5, a sixth MOS transistor MOS6, a first mirror unit 135, and a second mirror unit 136. The other end of the first high-voltage MOS transistor LD1 is connected to the first MOS transistor MOS1 among the multiple MOS transistors MOS through the fifth node E, the other end of the second high-voltage MOS transistor LD2 is connected to the second MOS transistor MOS2 among the multiple MOS transistors MOS through the sixth node F, and the third resistor R3 and the fourth resistor R4 may be connected in parallel with a diode DZ respectively.

In an example, when common mode noise is generated, the first switch MOS1, the second switch MOS2, the third switch MOS3 and the fourth switch MOS4 in the multiple switch MOS first convert the voltage signal into a current signal, the voltage signal of the fifth node E and the sixth node F is converted into a current signal, and the current in the first switch MOS1 is copied by the first mirror unit 135 and compared with the current in the second switch MOS2. Since the currents in the first switch MOS1 and the second switch MOS2 are equal, the output of the high-voltage level shift circuit 13 remains unchanged, and similarly, the currents in the third switch MOS3 and the fourth switch MOS4 are also equal. Exemplarily, when a normal differential mode signal is obtained, the set signal Set causes the fifth node E to be pulled down, and currents are generated in the first switch MOS1 and the third switch MOS3, so that the gate of the fifth switch MOS5 is pulled down, and the fifth switch MOS5 remains closed. The gate of the sixth switch MOS6 is pulled up, and the sixth switch MOS6 is turned on. The first signal OUT1 changes from a high level to a low level, and the second signal OUT2 remains high. The signal is transmitted normally.

In an example, the currents of the same magnitude generated by the common-mode signal cancel each other out to suppress the common-mode noise, and the CMTI capability is better at this time. However, since each component may have a certain deviation when leaving the factory, same component may also have a device mismatch problem. For example, when the resistance value of the third resistor R3 is slightly smaller than the resistance value of the fourth resistor R4, the high-voltage level shift circuit 13 will generate a certain differential-mode noise. A filter structure includes resistor R and capacitor C is needed to filter out the differential-mode noise. Additional delays will be generated, resulting in the high-voltage level shift circuit 13 having a better CMTI capability, but it is difficult to meet the needs of high-speed applications of the high-side switch Q1 and the low-side switch Q2 made of GaN material.

Figure 5:
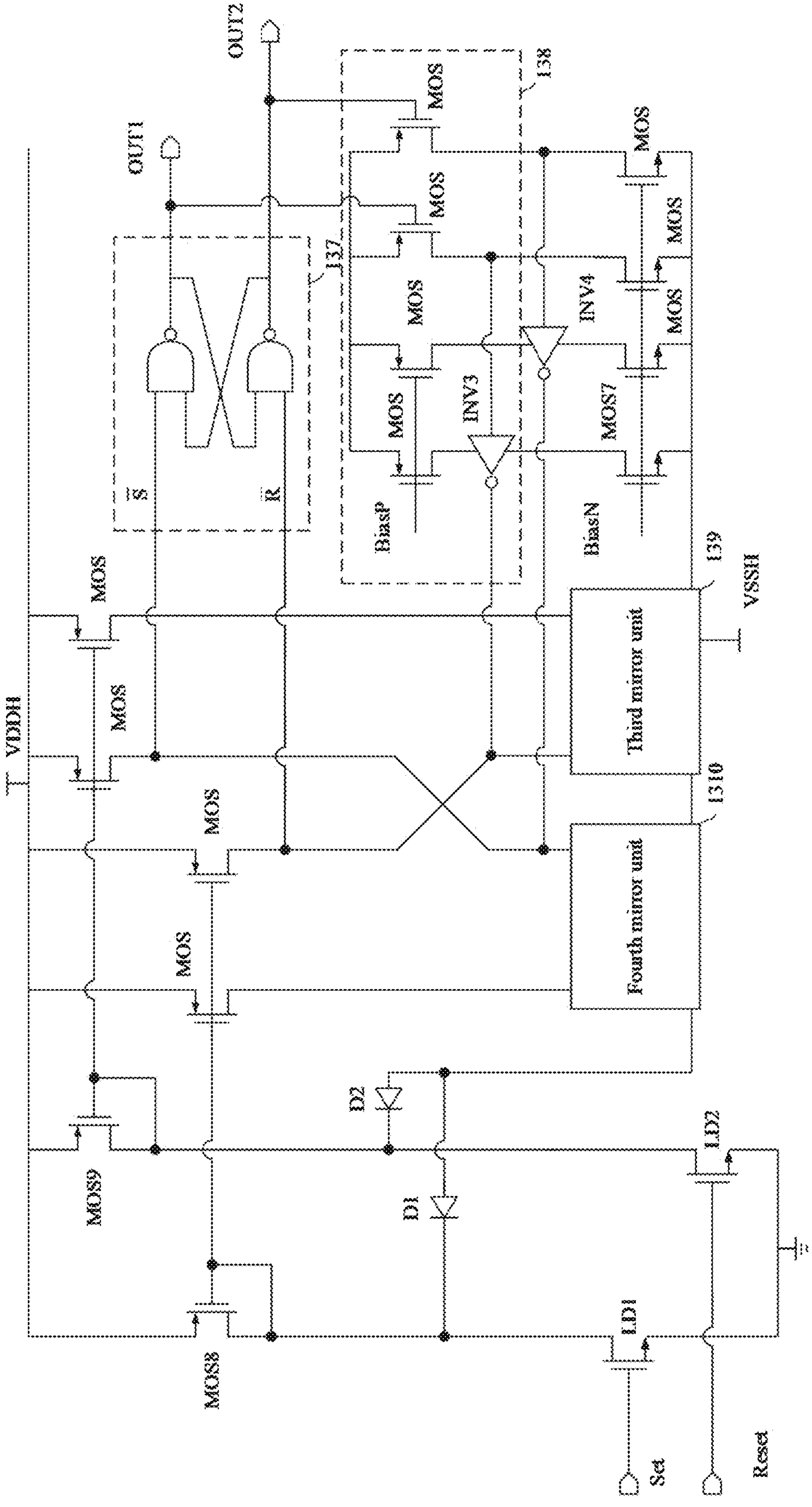
FIG. 5 is a schematic diagram of a circuit structure of a high-voltage level shift circuit.

An example is to suppress common mode noise by adopting a dual-loop interlocking structure and a bias current generated in MOS. As shown in FIG. 5, the high-voltage level shift circuit 13 may include a first high-voltage MOS transistor LD1, a second high-voltage MOS transistor LD2, a first-stage interlocking loop 137, a second-stage interlocking loop 138, a third mirror unit 139, a fourth mirror unit 1310, a third inverter INV1, a fourth inverter INV2, and a plurality of MOS transistors MOS.

In this example, when the high-voltage level shift circuit 13 works, the power-on reset circuit is configured to give the first-stage interlocking loop 137 an initial state, and the second-stage interlocking loop 138 is configured to strengthen the state. The initial state refers to the level of the first signal OUT1 and the second signal OUT2. For example, when the first signal OUT is reset after power-on, its initial state is a low level. The first bias current BiasN of the seventh MOS transistor MOS7 connected to the first signal OUT strengthens the pull-down of the MOS in the third mirror unit. The input signal VIN make the current generated in the eighth MOS transistor MOS8 connected to the first high-voltage MOS transistor LD1 the sum of the current in the ninth MOS transistor MOS9 connected to the second high-voltage MOS transistor LD2 and the current in the seventh MOS transistor MOS7. The output state be reversed. Therefore, without introducing the filtering structure including the resistor R and the capacitor C, it has good elimination capabilities for both common-mode noise and differential-mode noise.

The CMTI capability can be achieved through the dual-loop interlocking structure and the seventh MOS transistor MOS7, the eighth MOS transistor MOS8, and the ninth MOS transistor MOS9, and no additional filtering structure is required. Although this solution has good elimination capabilities for both common-mode and differential-mode noise without introducing a filtering structure, the ability of the high-voltage level shift circuit 13 to resist differential-mode noise is limited by the first bias current BiasN and the second bias current BiasNP. When making the high-voltage level shift circuit 13, the first bias current BiasN and the second bias current BiasNP are preset, that is, fixed bias currents. Based on the fixed bias current, fixed differential-mode noise can be affected. When the differential-mode noise has a certain change setting, the bias current of each MOS transistor MOS cannot be flexibly adjusted, resulting in low adjustment flexibility, that is, the ability of the high-voltage level shift circuit 13 to resist differential-mode noise is limited by the fixed bias current (that is, the first bias current BiasN and the second bias current BiasNP). The control loop of the circuit is complex, and an additional static bias circuit needs to be provided to provide the first bias current BiasN and the second bias current BiasNP for the MOS transistor MOS, resulting in high manufacturing cost and high power consumption.

Embodiments of the present application provide a level shift circuit and a high-voltage half-bridge driver chip. The level shift circuit can filter out common-mode noise to ensure the stability of the output signal, and does not require the setting of large resistors or capacitors, thereby reducing delays and improving the speed of signal transmission.

Figure 6:
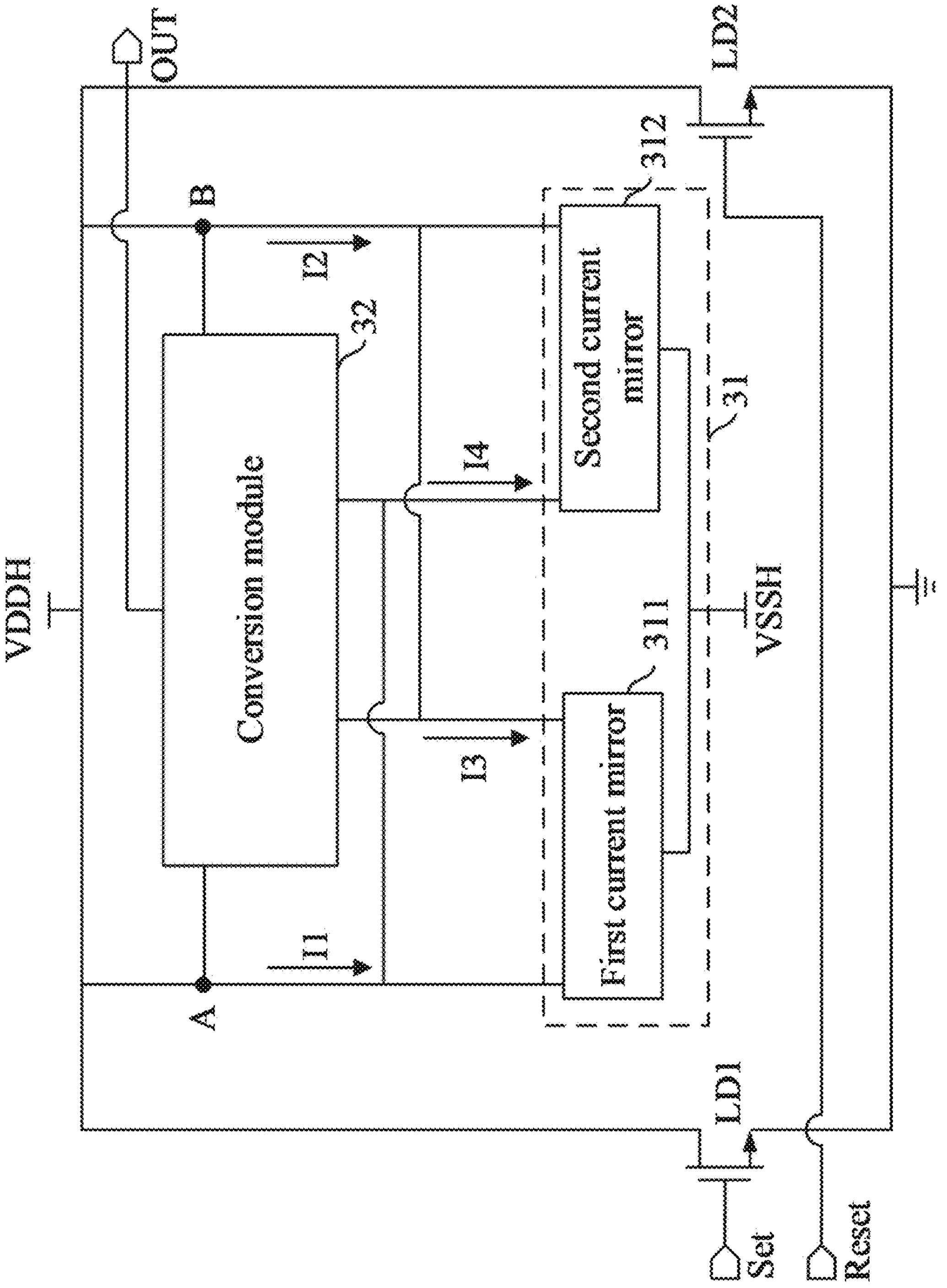
FIG. 6 is a schematic diagram of a circuit structure of a level shift circuit according to an embodiment of the present application.

As shown in FIG. 6, a level shift circuit 3 provided in an embodiment may include a first high-voltage MOS transistor LD1, a second high-voltage MOS transistor LD2, a cross-coupling module 31 and a conversion module 32, where a controlled end of the first high-voltage MOS transistor LD1 is configured to obtain the set signal Set, a first end of the first high-voltage MOS transistor LD1 is grounded, a second end of the first high-voltage MOS transistor LD1 is configured to obtain the power supply voltage, a controlled end of the second high-voltage MOS transistor LD2 is configured to obtain the reset signal Reset, a first end of the second high-voltage MOS transistor LD2 is grounded, and a second end of the second high-voltage MOS transistor LD2 is configured to obtain the power supply voltage, and the power supply voltage refers to the second power supply voltage VDDH. Since the first high-voltage MOS transistor LD1 and the second high-voltage MOS transistor LD2 are high-voltage transistors, their first end and second section can withstand the high-voltage of the second power supply voltage VDDH, that is, the drain-source voltage of the first high-voltage MOS transistor LD1 and the second high-voltage MOS transistor LD2 can withstand the high-voltage of the second power supply voltage VDDH, so as to ensure that the reliability of the level shift circuit 3 is achieved by controlling the on and off of the first high-voltage MOS transistor LD1 and the second high-voltage MOS transistor LD2. The first high-voltage MOS transistor LD1 and the second high-voltage MOS transistor LD2 can convert the narrow pulse voltage signal into a narrow pulse current signal.

As shown in FIG. 6, the cross-coupling module 31 includes a first current mirror 311 and a second current mirror 312. A first end of the first current mirror 311 is configured to obtain the first current I1 when the first high-voltage MOS transistor LD1 is turned on, and a second end of the first current mirror 311 is grounded. A first end of the second current mirror 312 is configured to obtain the second current I2 when the second high-voltage MOS transistor LD2 is turned on, and a second end of the second current mirror 312 is grounded. A first end of the conversion module 32 is connected to a first end of the first current mirror 311 through the first node A, a second end of the conversion module 32 is connected to a first end of the second current mirror 312 through the second node B, a third end of the conversion module 32 is respectively connected to a third end of the first current mirror 311 and the second node B, a fourth end of the conversion module 32 is respectively connected to a third end of the second current mirror 312 and the first node A, and a fifth end of the conversion module 32 is configured to output the output signal OUT.

In an example, after power-on, a reset phase will be performed. During the reset phase, a reset signal Reset is triggered, the reset signal Reset is high level, a set signal Set is low level, the first high-voltage MOS transistor LD1 is turned off, and the second high-voltage MOS transistor LD2 is turned on, generating a second current I2. The second node B is connected to the second current I2, and a potential of the second node B becomes higher, the potential of the second node B is higher than the potential of the first node A, then the output signal OUT output by the conversion module 32 is low level. When the reset phase ends, under the positive feedback of the cross-coupling module 31, the voltage of the second node B will remain at a high potential, and, the first node A maintains a low potential close to the second ground voltage VSSH due to the pull-down of the fourth current I4, and the output signal OUT output by the conversion module 32 still remains at a low level.

Figure 7:
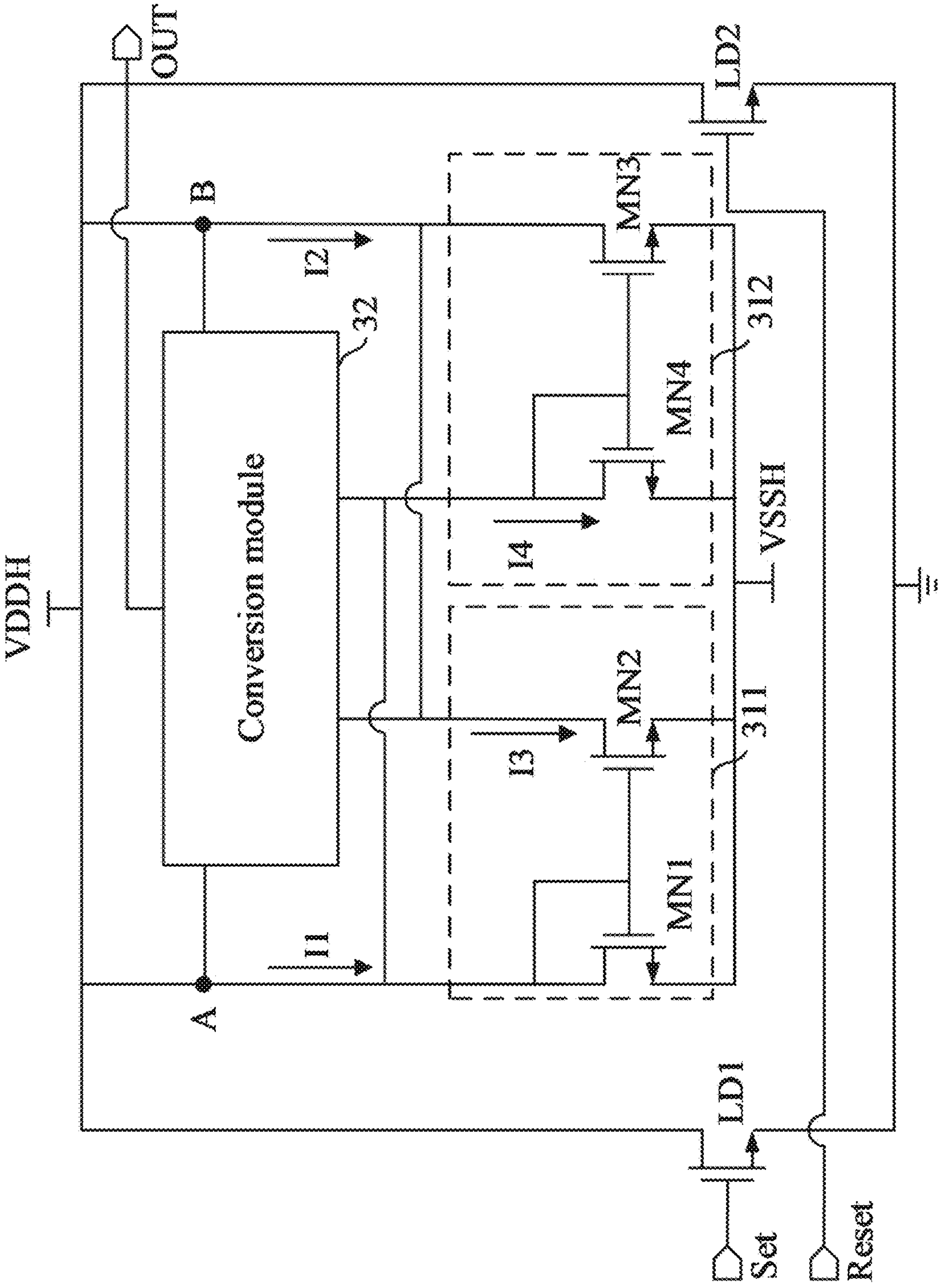
FIG. 7 is a schematic diagram of a circuit structure of a level shift circuit according to an embodiment of the present application.

As shown in FIG. 7, the first current mirror 311 in the cross-coupling module 31 may include a first N-type metal-oxide-semiconductor (N-Metal Oxide Semiconductor Field Effect Transistor, NMOS) transistor MN1 and a second NMOS transistor MN2, and the second current mirror 312 may include a third NMOS transistor MN3 and a fourth NMOS transistor MN4. The drain of the first NMOS transistor MN1 is configured to obtain the first current I1, the drain of the second NMOS transistor MN2 is configured to obtain the third current I3, the drain of the third NMOS transistor MN3 is configured to obtain the second current I2, and the drain of the fourth NMOS transistor MN4 is configured to obtain the fourth current I4. In this way, when the reset phase ends, under the positive feedback of the cross-coupling module 31, the voltage of the second node B will maintain the high potential of the gate-source voltage VGS of the second NMOS transistor MN2.

Figure 8:
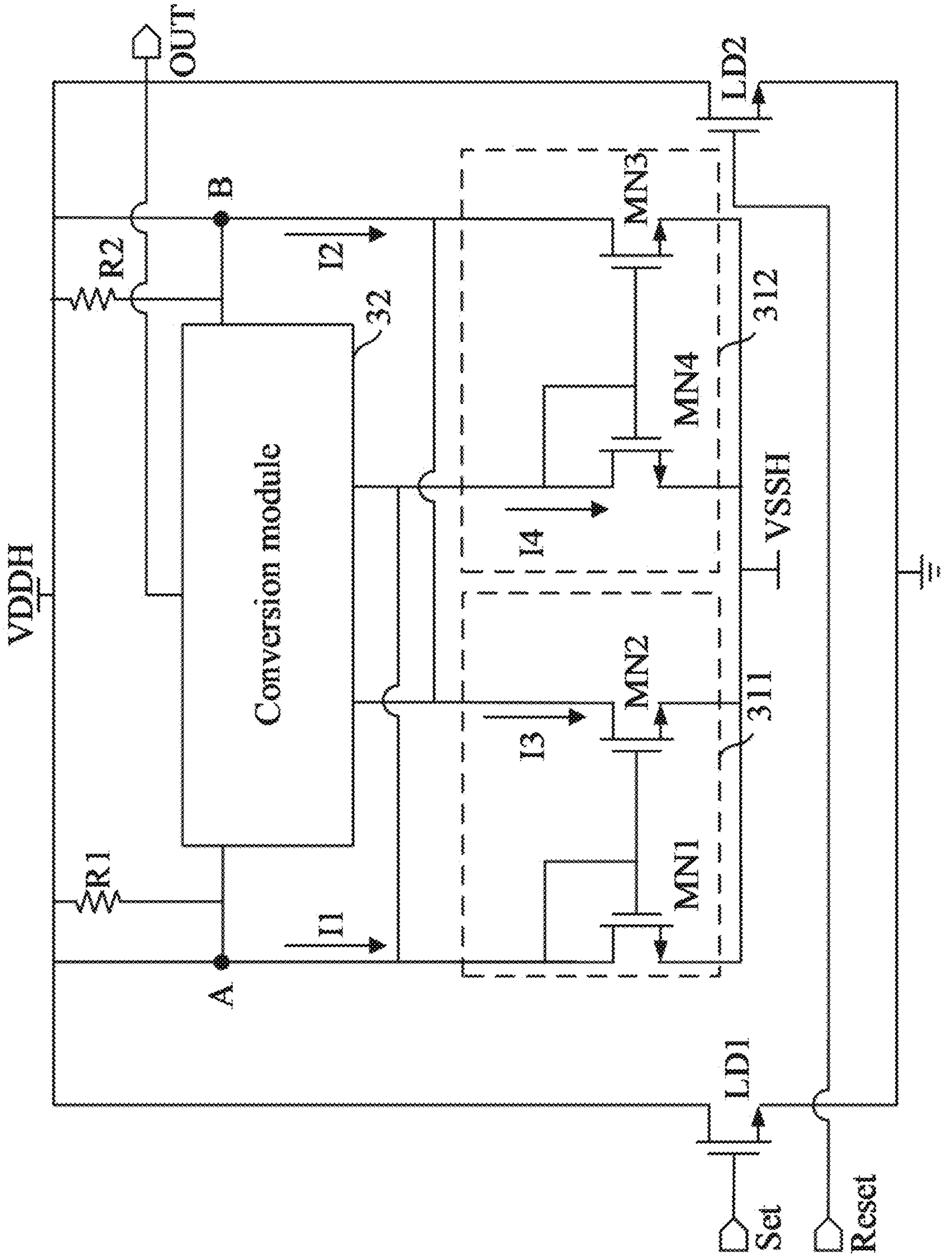
FIG. 8 is a schematic diagram of the circuit structure of a level shift circuit according to an embodiment of the present application.

In an example, as shown in FIG. 8, the level shift circuit 3 may include a first resistor R1 and a second resistor R2, one end of the first resistor R1 is configured to connect to the second power supply voltage VDDH, the other end of the first resistor R1 is connected to the first node A and a first end of the conversion module 32, one end of the second resistor R2 is configured to connect to a second power supply voltage VDDH, and the other end of the second power supply voltage VDDH is connected to the second node B and a second end of the conversion module 32. In an example, the resistance of the first resistor R1 and the second resistor R2 is the same. After the reset stage, the voltage of the second node B is maintained at a high potential of the gate-source voltage VGS. Assuming that the voltage of the second node B is 0.7V (volts), a current of the second node B (e.g., the second current I2) is (VDDH-0.7)/R2. At this time, a current of the first node A (e.g., the first current I1) is VDDH/R1, and the current of the second node B is less than the current of the first node A, that is, the first current I1 is greater than the second current 12, which means that the fourth current I4 can be determined by the second power supply voltage VDDH and the first resistor R1, and the second current I2 can be determined by the gate-source voltage of the resistor R2 and the second NMOS transistor MN2. For example, by adjusting the resistance of the first resistor R1 and the second resistor R2, the magnitude of the fourth current 14 and the second current I2 can be changed.

When a normal differential signal is generated, the set signal Set is high level, the reset signal Reset is low level, the second high-voltage MOS transistor LD2 is turned off, the first high-voltage MOS transistor LD1 is turned on, and the first current I1 is generated. The first node A is connected to the first current I1, the potential of the first node A becomes higher, and the first current I1 is greater than the second current I2, that is, the second current I2 is smaller. At this time, the potential of the second node B is pulled down by the third current I3, so that the potential of the first node A is higher than the potential of the second node B. The output signal OUT output by the conversion module 32 is high level, and the output signal OUT is normal.

In an example, during the reset phase and when the normal differential signal comes, signal OUT output by the level shift circuit 3 is in a normal state.

Figure 9:
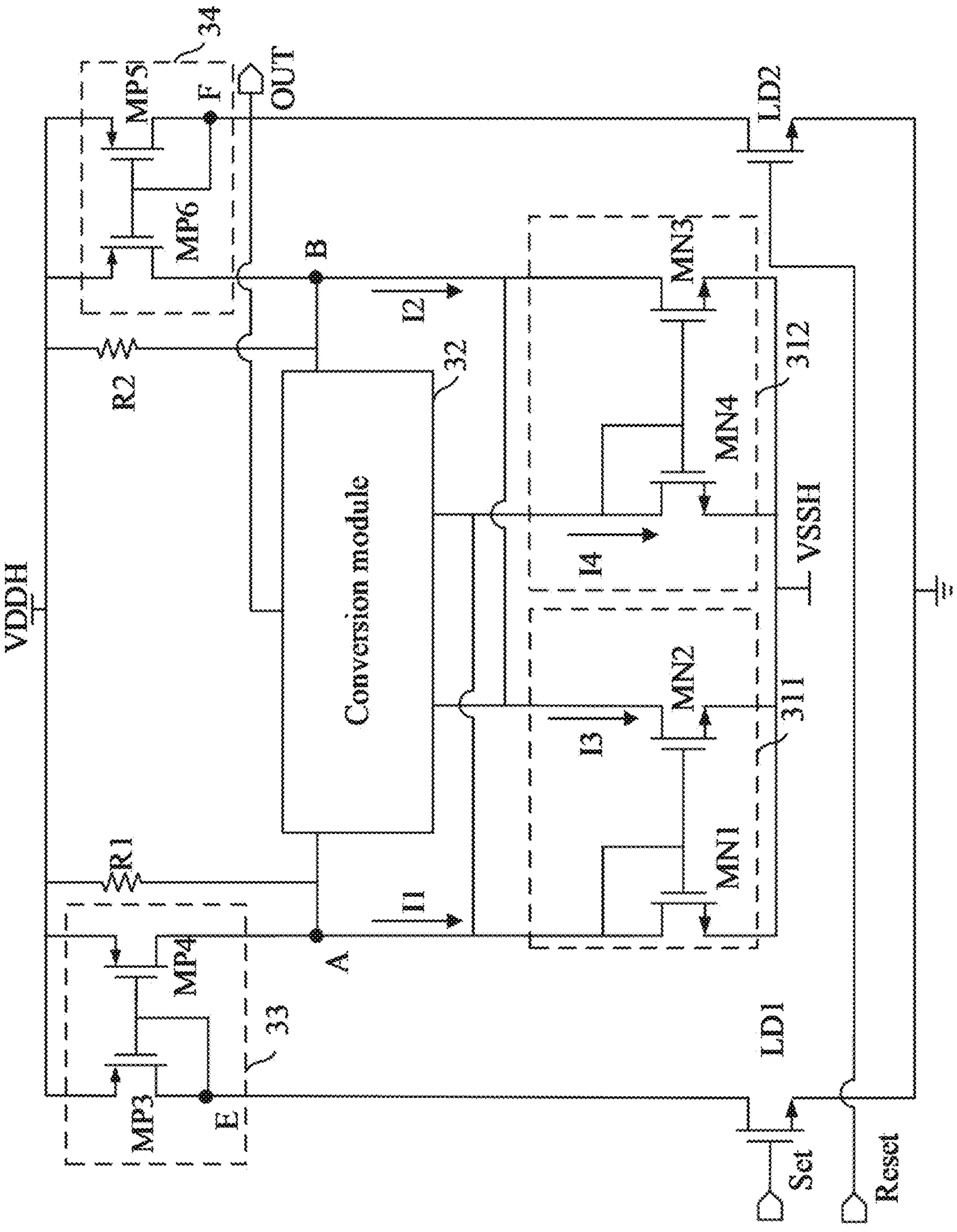
FIG. 9 is a schematic diagram of a circuit structure of a level shift circuit according to an embodiment of the present application.

In an example, as shown in FIG. 9, the level shift circuit 3 includes a third current mirror 33 and a fourth current mirror 34. A first end of the third current mirror 33 is connected to a second end of the first high-voltage MOS transistor LD1 through a fifth node E. A second end of the third current mirror 33 is configured to obtain the second power supply voltage VDDH. A third end of the third current mirror 33 is connected to the first node A. When the first high-voltage MOS transistor LD1 is turned on, the current flowing through the third current mirror 33 is copied to the first current I1. A first end of the fourth current mirror 34 is connected to the second end of the second high-voltage MOS transistor LD2 through a sixth node F. A second end of the fourth current mirror 34 is configured to obtain the second power supply voltage VDDH. A third end of the fourth current mirror 34 is connected to the second node B. When the second high-voltage MOS transistor LD2 is turned on, the current flowing through the fourth current mirror 34 is copied to the second current I2. By setting the mirror ratio of the third current mirror 33 and the fourth current mirror 34, the values of the first current I1 and the second current I2 can be changed.

In an example, as shown in FIG. 9, the third current mirror 33 may include a third PMOS transistor MP3 and a fourth PMOS transistor MP4, the gates of the third PMOS transistor MP3 and the fourth PMOS transistor MP4 are connected, and connected to the drain of the third PMOS transistor MP3, the drain of the third PMOS transistor MP3 is connected to the second end (the drain as shown in the figure) of the first high-voltage MOS transistor LD1 through the fifth node E, the drain of the fourth PMOS transistor MP4 is connected to the first node A, and the sources of the third PMOS transistor MP3 and the fourth PMOS transistor MP4 are connected to the second power supply voltage VDDH. When the first high-voltage MOS transistor LD1 is turned on, the fourth PMOS transistor MP4 mirrors the current flowing through the third PMOS transistor MP3 to obtain the first current I1.

The fourth current mirror 34 may include a fifth PMOS transistor MP5 and a sixth PMOS transistor MP6, and the connection structure and replication principle of the fifth PMOS transistor MP5 and the sixth PMOS transistor MP6 are similar to the third current mirror 33.

Figure 10:
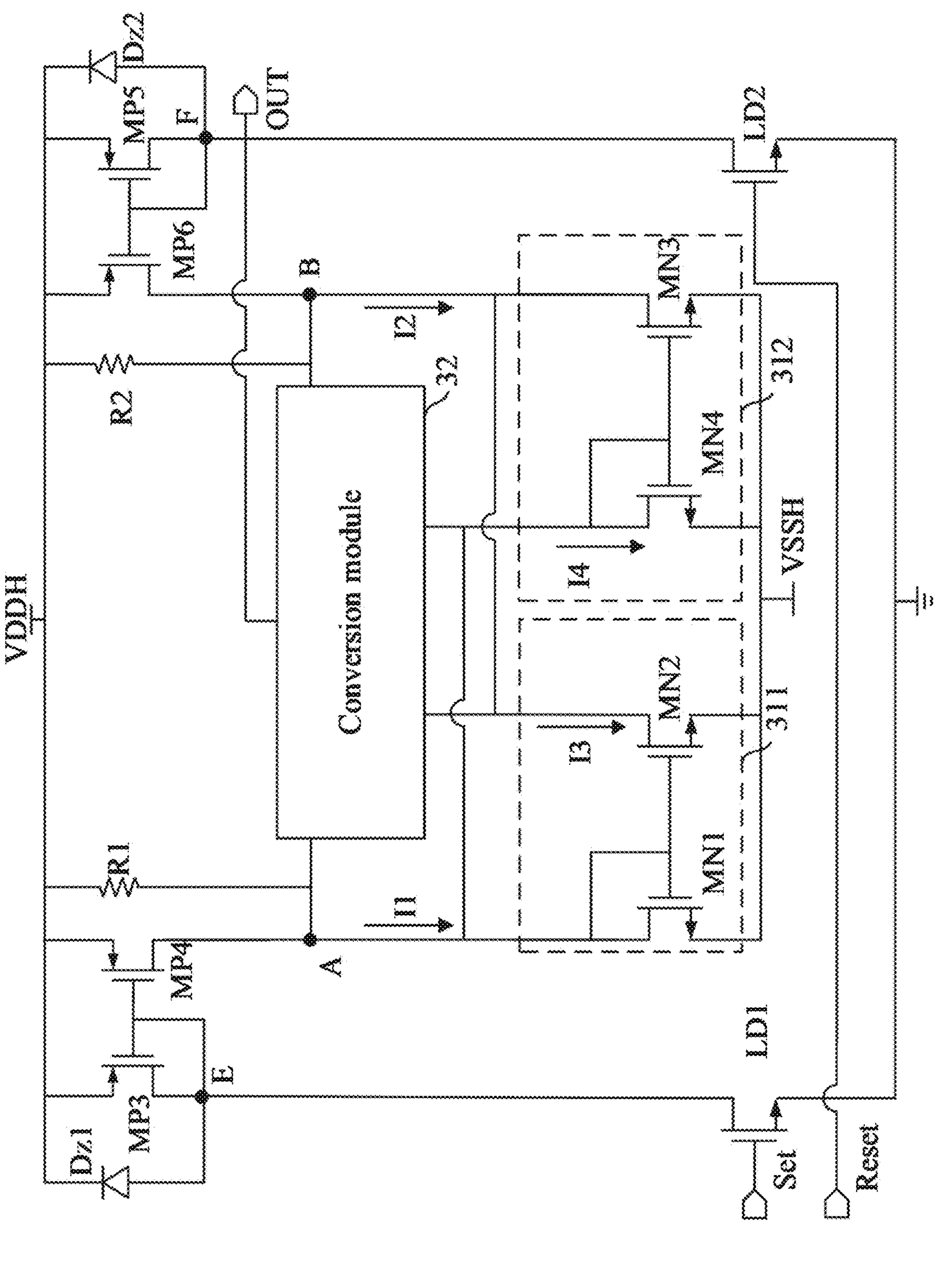
FIG. 10 is a schematic diagram of a circuit structure of a level shift circuit according to an embodiment of the present application.

In order to avoid the problem of breakdown of the subsequent circuit due to the excessive voltage difference between the fifth node E and the sixth node F and the second power supply voltage VDDH, as shown in FIG. 10, the level shift circuit 3 may include a first voltage regulator diode Dz1 and a second voltage regulator diode Dz2, where the first voltage regulator diode Dz1 is connected in parallel with the third PMOS transistor MP3, and the positive electrode of the first voltage regulator diode Dz1 is connected to the fifth node E, and the second voltage regulator diode Dz2 is connected in parallel with the fifth PMOS transistor MP5, and the positive electrode of the second voltage regulator diode Dz2 is connected to the sixth node F. Since the voltage across the first voltage regulator diode Dz1 and the second voltage regulator diode Dz2 will remain at the rated value after reaching the rated value, the voltage across the first voltage regulator diode Dz1 and the second voltage regulator diode Dz2 will not increase even if the current is increased, thus avoiding the problem of breakdown of the subsequent circuit due to the excessive voltage difference between the fifth node E and the sixth node F and the second power supply voltage VDDH, ensuring the reliability of the level shift circuit 3.

When the second ground voltage VSSH and the second power supply voltage VDDH in the high-voltage half-bridge driver chip 1 rise rapidly to generate a large dV/dt, the level shift circuit 3 will generate common-mode noise. The potentials at the fifth node E and the sixth node F are both low relative to the second power supply voltage VDDH, and the generated first current I1 is equal to the second current I2. The level shift circuit 3 remains in the power-on reset state, that is, the potential of the first node A continues to be lower than the potential of the second node B, resulting in the output signal OUT being always at a low level, and the output signal OUT is abnormally affected by the common-mode noise.

In order to ensure that the potential of the first node A is higher than the potential of the second node B after the level shift circuit 3 generates common-mode noise, so that the output signal OUT is at a high level, the first current I1 needs to be greater than or equal to N times the second current I2, where N is a positive integer. Taking FIG. 10 as an example, a width-to-length ratio of the second NMOS transistor MN2 needs to be greater than a width-to-length ratio of the first NMOS transistor MN1, for example, the width-to-length ratio of the second NMOS transistor MN2 can be N times the width-to-length ratio of the first NMOS transistor MN1, and the width-to-length ratio of the fourth NMOS transistor MN4 needs to be greater than the width-to-length ratio of the third NMOS transistor MN3, for example, the width-to-length ratio of the fourth NMOS transistor MN4 can be N times the width-to-length ratio of the third NMOS transistor MN3, so that the first current I1 needs to be greater than the fourth current I4, that is, the first current I1 needs to be greater than or equal to N times the second current I2. Thus, even if there is common mode noise, since the first current I1 is greater than or equal to N times the second current I2, the potential of the first node A is higher than the potential of the second node B, so that the output signal OUT output by the conversion module 32 is high level, that is, the output signal OUT is normal.

When the first current I1 is slightly larger than the second current I2 due to process mismatch, if there is a differential signal, the first current I1 needs to be larger than N times the second current I2. The width-to-length ratio of the second NMOS transistor MN2 can be set to N times the width-to-length ratio of the first NMOS transistor MN1, and the width-to-length ratio of the fourth NMOS transistor MN4 can be set to N times the width-to-length ratio of the third NMOS transistor MN3. When there is a differential signal, the first current I1 is greater than or equal to N times the second current I2. The differential noise caused by the mismatch needs to be greater than (N-1)*the second current I2, (N-1)*the second current I2 is the difference between the first current I1 and the second current I2, and the currents corresponding to the first current I1 and the second current I2 are different. The differential noise caused by the mismatch needs to be greater than (N-1)*the minimum current Imin, where the minimum current Imin is the smaller value between the first current I1 and the second current I2.

For example, the first current I1 is greater than or equal to N times the second current I2. The potential of the first node A is higher than the potential of the second node B. The first current I1 generates a voltage on the first NMOS transistor MN1. The first NMOS transistor MN1 needs to be in the saturation region. In an example, a saturation region current-voltage formula (1) is:

$$I_1 = \frac{1}{2}\mu_n C_{ox}\frac{W_{N1}}{L_{N1}}(V_{GSN1} - V_{THN})^2 \quad (1)$$

$\mu_n$ is the electron mobility of the NMOS transistor, $C_{OX}$ is the gate oxide layer capacitance per unit area, $W_{N1}$ and $L_{N1}$ are the channel width and length of the first NMOS transistor MN1 respectively, $V_{GSN1}$ is the gate-source voltage of MN1, $V_{THN}$ and is the threshold voltage of the first NMOS transistor MN1.

Based on the above formula (1), we can get formula (2):

$$V_{GSN1} = V_{THN} + \sqrt{\frac{2I_1L_{N1}}{\mu_n C_{ox} W_{N1}}} \quad (2)$$

Where, $I_1$ is the current value of the first current.

Figure 11:
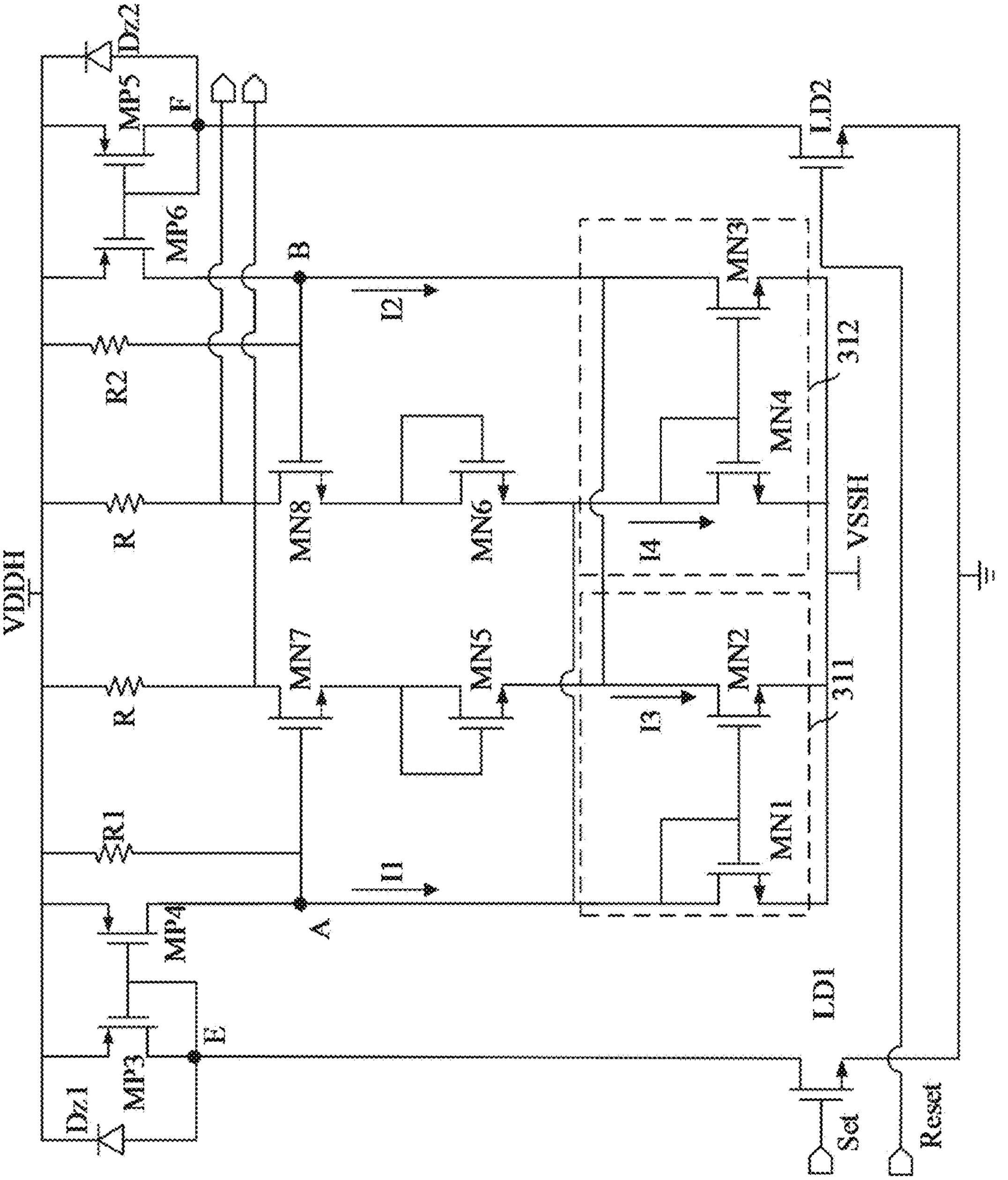
FIG. 11 is a schematic diagram of a circuit structure of a level shift circuit according to an embodiment of the present application.

In an example, as shown in FIG. 11, the conversion module 32 may include a fifth NMOS transistor MN5, a sixth NMOS transistor MN6, a seventh NMOS transistor MN7, and an eighth NMOS transistor MN8, where the source of the fifth NMOS transistor MN5 is respectively connected to the drain of the second NMOS transistor MOS2 and the drain of the third NMOS transistor MOS3, and the gate of the fifth NMOS transistor MN5 is short-circuited to the drain of the fifth NMOS transistor MN5. The source of the sixth NMOS transistor MN6 is respectively connected to the drain of the fourth NMOS transistor MN4 and the drain of the first NMOS transistor MN1, and the gate of the sixth NMOS transistor MN6 is short-circuited to the drain of the sixth NMOS transistor MN6. The source of the seventh NMOS transistor MN7 is connected to the drain of the fifth NMOS transistor MN5, the gate of the seventh NMOS transistor MN7 is connected to the first node A, the source of the eighth NMOS transistor MN8 is connected to the drain of the sixth NMOS transistor MN6, the gate of the eighth NMOS transistor MN8 is connected to the second node B, the drain of the seventh NMOS transistor MN7 is connected to the second power supply voltage VDDH through a resistor R, and the drain of the eighth NMOS transistor MN8 is connected to the second power supply voltage VDDH through a resistor R.

In an example, the fifth NMOS transistor MN5, the sixth NMOS transistor MN6, the seventh NMOS transistor MN7, and the eighth NMOS transistor MN8 can convert the voltage signals of the first node A and the second node B into current signals.

The voltage generated by the first current I1 in the first NMOS transistor MN1 needs to meet the turn-on condition of the seventh NMOS transistor MN7. According to the above formula (2), it is necessary to ensure that the gate-source voltage of MN1 SM1 is higher than the threshold voltage of the THN first NMOS transistor MN1 and the gate-source voltage of the fifth NMOS transistor MN5 GSN's,in order to turn on the seventh NMOS transistor MN7.

Figure 12:
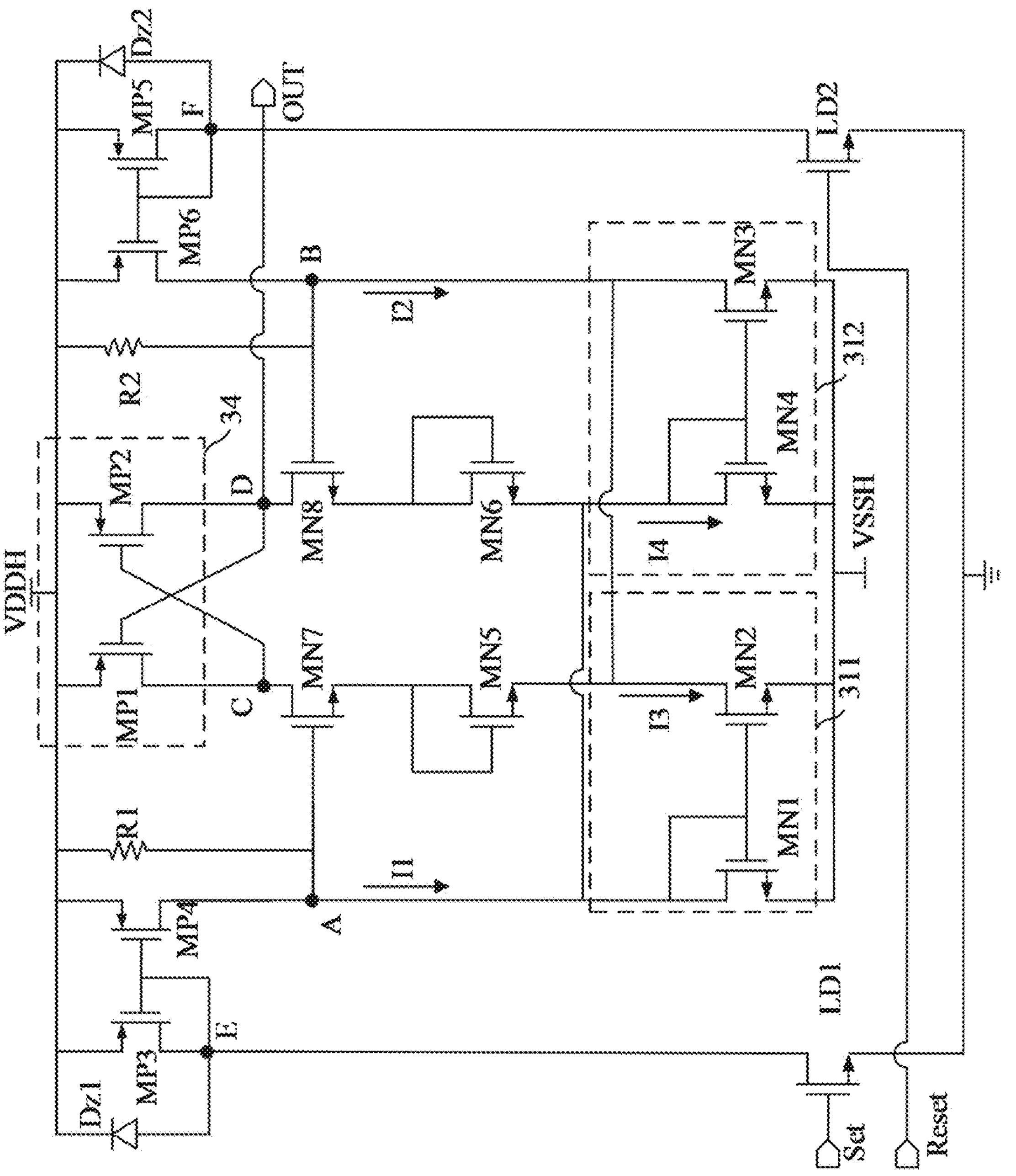
FIG. 12 is a schematic diagram of a circuit structure of a level shift circuit according to an embodiment of the present application.

In an example, the conversion module 32 outputs two voltage signals. In order to enable the conversion module 32 to directly output an output signal OUT, in an example, as shown in FIG. 12, the level shift circuit 3 may further include a positive feedback module 35, a first end of the positive feedback module 35 is connected to the drain of the seventh NMOS transistor MN7 through the third node C, a second end of the positive feedback module 35 is connected to the drain of the eighth NMOS transistor MN8 through the fourth node D, and a third end of the positive feedback module 35 is configured to obtain the second power supply voltage VDDH. The response speed of the level shift circuit 3 can be improved by the positive feedback module 35, and the narrow pulse signal can be restored to a square wave signal and output, that is, the positive feedback module 35 is the latch RS, and can output an output signal OUT, which is a square wave signal.

Exemplarily, as shown in FIG. 12, the positive feedback module 23 may include a first PMOS transistor MP1 and a second PMOS transistor MP2, the gate of the first PMOS transistor MP1 is connected to the fourth node D, the source of the first PMOS transistor MP1 is configured to obtain the second power supply voltage VDDH, the drain of the first PMOS transistor MP1 is connected to the drain of the seventh NMOS transistor MN7 and the third node C, the gate of the second PMOS transistor MP2 is connected to the third node C, the source of the second PMOS transistor MP2 is configured to obtain the second power supply voltage VDDH, and the drain of the second PMOS transistor MP2 is connected to the drain of the eighth NMOS transistor MN8.

When the set signal Set is at a high level, the potential of the fifth node E decreases, the potential of the first node A increases, and is higher than the potential of the second node B, then the seventh NMOS transistor MN7 is turned on, the eighth NMOS transistor MN8 is turned off, the potential of the third node C becomes low, and the potential of the fourth node D becomes high, and at this time the output signal OUT is at a high level.

In an example, if the seventh NMOS transistor MN7 is to be turned on, the third node C and the fourth node D are flipped and satisfy formula (3):

$$VDDH = VC = |V_{THP}| \quad (3)$$

Where $I_1$ is the current value of the first current, VC is the voltage of the third node C, and $V_{THP}$ is the threshold voltage of the first PMOS transistor MP1.

The first PMOS transistor MP1 is in the linear region, and the seventh NMOS transistor MN7 is in the saturation region. Since the currents flowing through the first PMOS transistor MP1 and the seventh NMOS transistor MN7 are equal. In an example, formula (4) can be obtained:

$$\frac{1}{2}\mu_n C_{ox}\frac{W_{N1}}{L_{N1}}(V_{GSN1} - V_{THN} - V_{GSN5})^2 = \mu_p C_{ox}\frac{W_{P1}}{L_{P1}}(V_{dsotP1})|V_{THP}| \quad (4)$$

$V_{dsatP1}$ is the electron mobility of the first PMOS transistor MP1, and, $V_{dsatP1}$=VDDH−VSSH-|$V_{THP}$|, an $W_{N7}$ and $L_{N7}$ are respectively the channel width and length of the seventh NMOS transistor MN7, $\mu_P$ and are respectively the channel width and length of the first PMOS transistor MP1, $\mu_p$ is the electron mobility of the PMOS transistor, $V_{ASN5}$ and is the gate-source voltage of the fifth NMOS transistor MN5.

In an example, formula (5) is obtained:

$$I_1 = \frac{\mu_n C_{ox} W_{N1}(V_{GSN5})^2}{2} + \frac{2\mu_p{}^2 C_{ox} W_{N1} W_{P1}{}^2 L_{N7}}{2}(V_{dsotP1})|V_{THP}| + \frac{\mu_n C_{ox} W_{N1}\text{V\_GSN5}}{L_{N1}}\sqrt{\frac{2\mu_p W_{P1} L_{N7}}{\mu_n L_{P1} W_{N7}}(V_{dsotP1}|V_{THP}|} \quad (5)$$

By adjusting the value of N, the size (e.g., width-to-length ratio) of the fifth NMOS transistor MN5, the sixth NMOS transistor MN6, the seventh NMOS transistor MN7, and the eighth NMOS transistor MN8, the ability of the level shift circuit 3 to withstand dV/dt can be changed. Under the conditions of a fixed multiple relationship and device size, the process adaptation is fixed. The larger the dV/dt, the greater the differential mode noise generated in the adaptation. The first current I1 will be much larger than the second current I2, and the larger (N-1)*Imin will be, the better the filtering effect will be, and the higher the suppression of differential mode noise by the level shift circuit 3 will be. The first current I1 may be too large and will affect normal signal transmission, because the amplitude of the normal signal is much larger than the common mode or differential mode noise signal in this example. By making the first current I1 larger than N times the second current I2, that is, the first current I1 is larger than the second current 12, the potential of the first node A corresponding to the first current I1 is higher than the potential of the second node B corresponding to the second current I2, and even if there is common mode noise, it can be filtered out by (N-1)*Imin. Since the potential of the first node A is higher than the potential of the second node B, the output signal OUT is always maintained at a high level, that is, the output signal OUT has no duty cycle loss, and high CMTI capability is achieved without introducing large capacitance and large bias current.

While achieving high CMTI capability, low transmission delay can be achieved to speed up the response speed, that is, to improve the speed of signal transmission. Since the conversion module 32 is a positive feedback structure, when the first current I1 is N times the second current 12, since the width-to-length ratio of the second NMOS transistor MN2 is N times that of the first NMOS transistor MN1, the third current I3 is equal to N times the first current I1, that is, the third current I3 is greater than the second current I2. The level of the second node B is pulled down by the third current I3, so that the fourth current I4 becomes smaller, and the pull-down of the first node C is weakened. The first node C will rise rapidly to achieve low transmission delay and improve the speed of signal transmission.

The level shift circuit 3 provided in an embodiment can generate (N-1)*I2 by making the first current I1 greater than the second current I2, so as to filter out the common-mode noise and ensure the reliability of the output signal OUT. When the first current I1 is N times the second current I2, since the cross-coupling module 31 formed by the first current mirror 311 and the second current mirror 312 is a positive feedback structure, the potential of the second node B can be further lowered, and the pull-down of the first node C is weakened, then the first node C will rise rapidly to achieve low transmission delay, speed up the response speed, and improve the speed of signal transmission. Since the level shift circuit 3 is provided with the first resistor R1 and the second resistor R2, and no filter capacitor is provided, the static power consumption is small. The positive feedback module 23 can replace the latch RS in the related art, simplify the circuit structure, make the circuit structure simple, and have low manufacturing cost.

Figure 13:
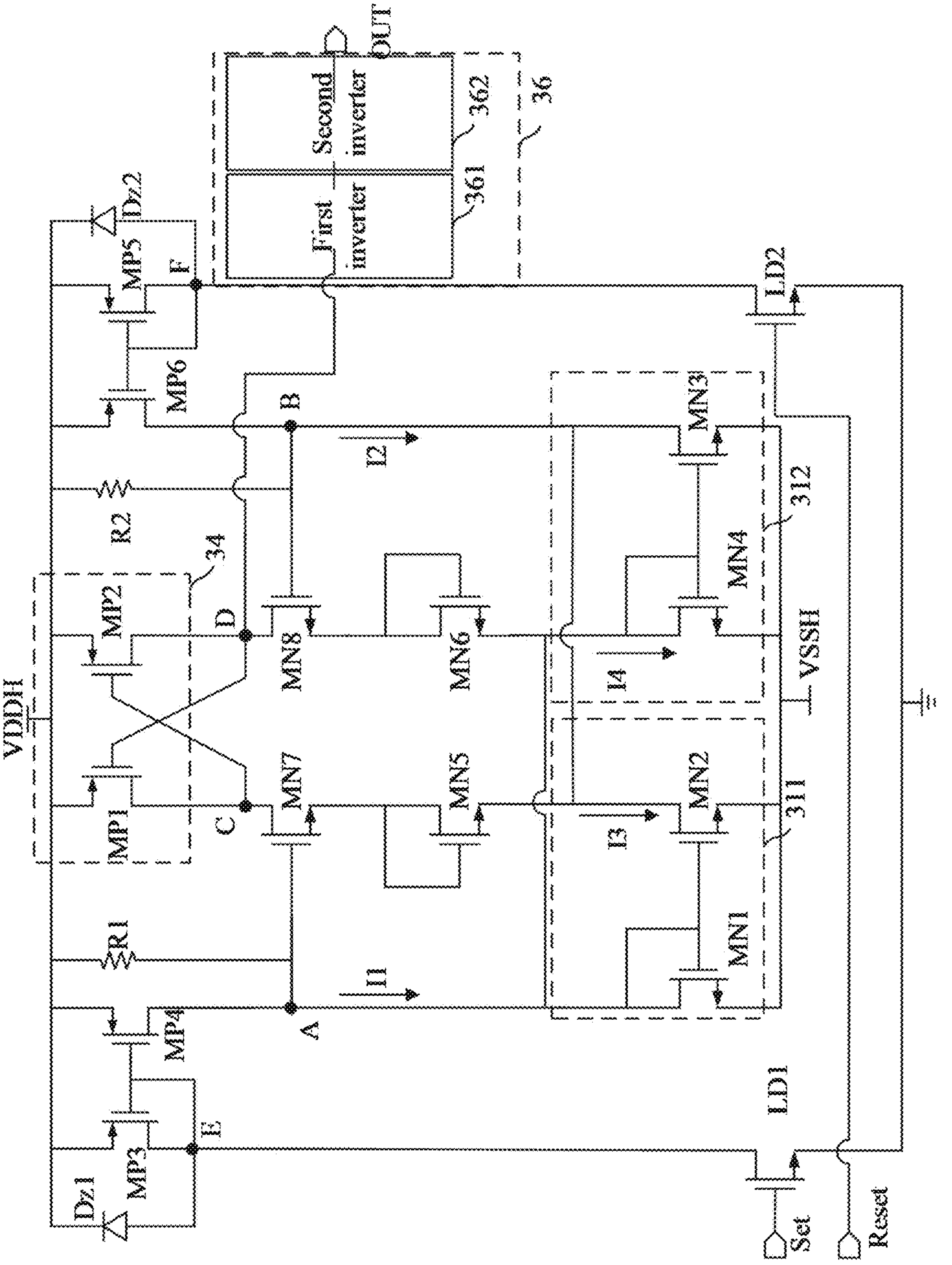
FIG. 13 is a schematic diagram of a circuit structure of a level shift circuit according to an embodiment of the present application.

In an example, as shown in FIG. 13, the level shift circuit 3 may further include a shaping module 36, a first end of the shaping module 36 is connected to a fourth node D, a second end of the shaping module 36 is configured to obtain a second power supply voltage VDDH, a third end of the shaping module 36 is grounded, and a fourth end of the shaping module 36 is configured to output an output signal OUT.

Exemplarily, as shown in FIG. 13, the shaping module 36 may include a first inverter 361 and a second inverter 362, the first end of the first inverter 361 is connected to the fourth node D, the second end of the first inverter 361 is configured to obtain the second power supply voltage VDDH, the third end of the first inverter 361 is grounded, the first end of the second inverter 362 is connected to the fourth end of the first inverter 361, the second end of the second inverter 362 is configured to obtain the second power supply voltage VDDH, the third end of the second inverter 362 is grounded, and the fourth end of the second inverter 362 is configured to output the output signal OUT.

In some embodiments, the first inverter 361 and the second inverter 362 may both include a PMOS and an NMOS, or may be other structures.

Figure 14:
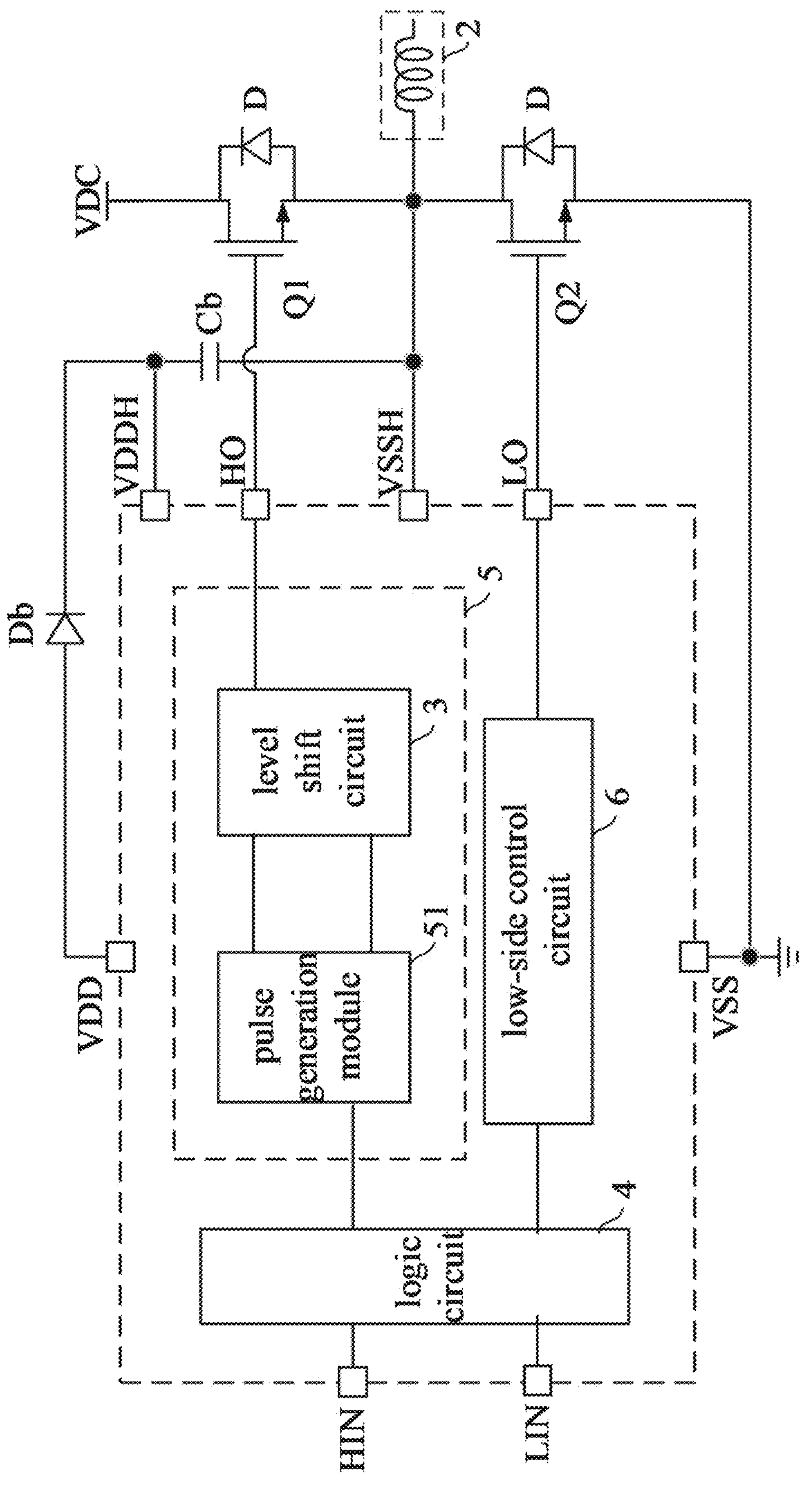
FIG. 14 is a schematic diagram of a framework structure of a high-voltage half-bridge driver chip provided in an embodiment of the present application.

An embodiment provides a high-voltage half-bridge driver chip, as shown in FIG. 14, the high-voltage half-bridge driver chip may include a logic circuit 4, a high-side control circuit 5, a low-side control circuit 6, a high-side switch Q1 and a low-side switch Q2, where a first input end of the logic circuit 4 is configured to obtain the high-side control signal HIN, a second input end of the logic circuit 4 is configured to obtain the low-side control signal LIN, and the high-side control circuit 5 includes a pulse generation module 51 and the level shift circuit 3. An input end of the pulse generation module 51 is connected to the first output end of the logic circuit 4, and is configured to generate a set signal Set and a reset signal Reset, the first input end of the level shift circuit 3 is configured to obtain the set signal Set, the second input end of the level shift circuit 3 is configured to obtain the reset signal Reset, the level shift circuit 3 can output an output signal OUT according to the set signal Set and the reset signal Reset, and an input end of the low-side control circuit 6 is connected to a second output end of the logic circuit 4. A controlled end of the high-side switch Q1 is connected to the output end of the high-side control circuit 5, a first end of the high-side switch Q1 is configured to obtain the DC voltage VDC, a second end of the high-side switch Q1 is connected to the load 2, a controlled end of the low-side switch Q2 is connected to an output end of the low-side control circuit 6, a first end of the low-side switch Q2 is grounded, and a second end of the low-side switch Q2 is connected to the load 2.

An embodiment of the present application provides a LiDAR, including the high-voltage half-bridge driver chip.

An embodiment of the present application also provides a movable device, which includes the LiDAR and a movable device body, and the LiDAR is mounted on the device body. The beneficial effects that can be achieved by the movable device include the beneficial effects that can be achieved by the above LiDAR.

Through the description of the above implementation methods, the division of the above-mentioned functional modules is used as an example. The functions can be assigned to different functional modules as needed, that is, the internal structure of the device can be divided into different functional modules to complete all or part of the functions described above.

In the embodiments provided in the present application, the disclosed devices can be implemented in other ways. For example, the device embodiments described above are only schematic, for example, the division of modules or units is only a logical function division, and there may be other division methods in actual implementation, such as multiple units or components can be combined or integrated into another device, or some features can be ignored or not executed. Another point is that the mutual coupling or direct coupling or communication connection shown or discussed can be through some interfaces, indirect coupling or communication connection of devices or units, which can be electrical, mechanical, or other forms.

The invention claimed is:

1. A level shift circuit, comprising:
- a first high-voltage MOS transistor, having a controlled end for receiving a setting signal, a first end for connecting to a first ground, and a second end for receiving a power supply voltage;
- a second high-voltage MOS transistor, having a controlled end for receiving a reset signal, a first end for connecting to the first ground, and a second end for receiving the power supply voltage;
- a cross-coupling module, comprising a first current mirror and a second current mirror, wherein
- a first end of the first current mirror is configured to obtain a first current when the first high-voltage MOS transistor is turned on, and a second end of the first current mirror is connected to a second ground; and
- a first end of the second current mirror is configured to obtain a second current when the second high-voltage MOS transistor is turned on, and a second end of the second current mirror is connected to the second ground, wherein the first current is greater than or equal to N times the second current, and N is a positive integer; and
- a conversion module, having a first end connected to the first end of the first current mirror through a first node, a second end connected to the first end of the second current mirror through a second node, a third end respectively connected to a third end of the first current mirror and the second node, a fourth end respectively connected to a third end of the second current mirror and the first node, and a fifth end configured to output an output signal,
- wherein the first current mirror comprises a first NMOS transistor and a second NMOS transistor, wherein a drain of the first NMOS transistor is configured to obtain the first current, a drain of the second NMOS transistor is configured to obtain a third current, and a width-to-length ratio of the second NMOS transistor is greater than a width-to-length ratio of the first NMOS transistor; and
- wherein the second current mirror comprises a third NMOS transistor and a fourth NMOS transistor, a drain of the third NMOS transistor is configured to obtain the second current, a drain of the fourth NMOS transistor is configured to obtain a fourth current, and a width-to-length ratio of the fourth NMOS transistor is greater than a width-to-length ratio of the third NMOS transistor, wherein the first current is greater than or equal to the fourth current,
- wherein the conversion module comprises:
  - a fifth NMOS transistor, having a source respectively connected to the drain of the second NMOS transistor and the drain of the third NMOS, and a gate and a drain being short-circuited;
  - a sixth NMOS transistor, having a source respectively connected to the drain of the fourth NMOS transistor and the drain of the first NMOS transistor, and a gate and a drain being short-circuited;
  - a seventh NMOS transistor, having a source connected to the drain of the fifth NMOS transistor, and a gate connected to the first node; and
  - an eighth NMOS transistor, having a source connected to the drain of the sixth NMOS transistor, and a gate connected to the second node.

2. The level shift circuit according to claim 1, further comprising:
- a first resistor, having one end configured to obtain the power supply voltage, and the other end connected to the first node and the gate of the seventh NMOS transistor; and
- a second resistor, having one end configured to obtain the power supply voltage, and the other end connected to the second node and the gate of the eighth NMOS transistor.

3. The level shift circuit according to claim 1, further comprising:
- a positive feedback module, having a first end connected to the drain of the seventh NMOS transistor via a third node, a second end connected to the drain of the eighth NMOS transistor via a fourth node, and a third end configured to obtain the power supply voltage.

4. The level shift circuit according to claim 3, wherein the positive feedback module comprises:
- a first PMOS transistor, having a gate connected to the fourth node, a source configured to obtain the power supply voltage, and a drain connected to the drain of the seventh NMOS transistor; and
- a second PMOS transistor, having a gate connected to the third node, a source configured to obtain the power supply voltage, and a drain connected to the drain of the eighth NMOS transistor.

5. The level shift circuit according to claim 1, further comprising:
- a third current mirror, having a first end connected to the second end of the first high-voltage MOS transistor via a fifth node, a second end configured to obtain the power supply voltage, and a third end connected to the first node; and a first voltage regulator diode, having one end connected to the fifth node, and the other end configured to obtain the power supply voltage.

* * * * *